(12) United States Patent
Brodsky et al.

(10) Patent No.: US 10,327,329 B2
(45) Date of Patent: Jun. 18, 2019

(54) TAMPER-RESPONDENT ASSEMBLY WITH FLEXIBLE TAMPER-DETECT SENSOR(S) OVERLYING IN-SITU-FORMED TAMPER-DETECT SENSOR

(71) Applicant: INTERNATIONAL BUSINESS MACHINES CORPORATION, Armonk, NY (US)

(72) Inventors: William L. Brodsky, Binghamton, NY (US); James A. Busby, New Paltz, NY (US); John R. Dangler, Rochester, MN (US); Silvio Dragone, Winterthur (CH); Michael J. Fisher, Poughkeepsie, NY (US); David C. Long, Wappingers Falls, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 290 days.

(21) Appl. No.: 15/430,842

(22) Filed: Feb. 13, 2017

(65) Prior Publication Data
US 2018/0235081 A1    Aug. 16, 2018

(51) Int. Cl.
*H05K 1/02* (2006.01)
*H05K 1/18* (2006.01)
(Continued)

(52) U.S. Cl.
CPC .......... *H05K 1/0275* (2013.01); *G08B 13/06* (2013.01); *H05K 1/185* (2013.01); *G08B 13/149* (2013.01); *H05K 2201/10151* (2013.01)

(58) Field of Classification Search
CPC .......... H05K 1/00; H05K 1/02; H05K 1/0275; H05K 1/18; H05K 1/182; H05K 1/185;
(Continued)

(56) References Cited

U.S. PATENT DOCUMENTS

| 3,165,569 A | 1/1965 | Bright et al. |
| 4,160,503 A | 7/1979 | Ohlbach |

(Continued)

FOREIGN PATENT DOCUMENTS

| CN | 2014-30639 Y | 3/2010 |
| CN | 10-4346587 A | 2/2015 |

(Continued)

OTHER PUBLICATIONS

Holm, Ragnar, "Electric Contacts: Theory and Application", Spinger-Verlag, New York, 4th Edition, 1981 (pp. 10-19).

(Continued)

*Primary Examiner* — Hoai-An D. Nguyen
(74) *Attorney, Agent, or Firm* — Tihon Poltavets, Esq.; Kevin P. Radigan, Esq.; Heslin Rothenberg Farley & Mesiti P.C.

(57) ABSTRACT

Tamper-respondent assemblies and methods of fabrication are provided which include an enclosure, an in-situ-formed tamper-detect sensor, and one or more flexible tamper-detect sensors. The enclosure encloses, at least in part, one or more electronic components to be protected, and the in-situ-formed tamper-detect sensor is formed in place over an inner surface of the enclosure. The flexible tamper-detect sensor(s) is disposed over the in-situ-formed tamper-detect sensor, such that the in-situ-formed tamper-detect sensor is between the inner surface of the enclosure and the flexible tamper-detect sensor(s). Together the in-situ-formed tamper-detect sensor and flexible tamper-detect sensor(s) facilitate defining, at least in part, a secure volume about the one or more electronic components.

20 Claims, 16 Drawing Sheets

(51) Int. Cl.
*G08B 13/06* (2006.01)
*G08B 13/14* (2006.01)

(58) Field of Classification Search
CPC ...... H05K 2201/10151; G01R 1/07328; G08B 13/00; G08B 13/02; G08B 13/06; G08B 13/14; G08B 13/149; F16B 41/00; F16B 41/005
USPC .............. 324/600, 649, 691, 693, 500, 537, 324/763.01, 76.11
See application file for complete search history.

(56) References Cited

U.S. PATENT DOCUMENTS

| | | |
|---|---|---|
| 4,211,324 A | 7/1980 | Ohlbach |
| 4,324,823 A | 4/1982 | Ray, III |
| 4,516,679 A | 5/1985 | Simpson |
| 4,496,900 A | 6/1985 | Di Stefano et al. |
| 4,593,384 A | 6/1986 | Kleinjne |
| 4,609,104 A | 9/1986 | Kasper et al. |
| 4,653,252 A | 3/1987 | Van de Haar et al. |
| 4,677,809 A | 7/1987 | Long et al. |
| 4,691,350 A | 9/1987 | Kleijne et al. |
| 4,807,284 A | 2/1989 | Kleijne |
| 4,811,288 A | 3/1989 | Kleijne et al. |
| 4,860,351 A | 8/1989 | Weingart |
| 4,865,197 A | 9/1989 | Craig |
| 5,009,311 A | 4/1991 | Schenk |
| 5,027,397 A | 6/1991 | Double et al. |
| 5,060,114 A | 10/1991 | Feinberg et al. |
| 5,075,822 A | 12/1991 | Baumler et al. |
| 5,117,457 A | 5/1992 | Comerford et al. |
| 5,159,629 A | 10/1992 | Double et al. |
| 5,185,717 A | 2/1993 | Mori |
| 5,201,868 A | 4/1993 | Johnson |
| 5,201,879 A | 4/1993 | Steele et al. |
| 5,211,618 A | 5/1993 | Stoltz |
| 5,239,664 A | 8/1993 | Verrier et al. |
| 5,389,738 A | 2/1995 | Piosenka et al. |
| 5,406,630 A | 4/1995 | Piosenka et al. |
| 5,506,566 A | 4/1996 | Oldfield et al. |
| 5,568,124 A | 10/1996 | Joyce et al. |
| 5,594,439 A | 1/1997 | Swanson |
| 5,675,319 A | 10/1997 | Rivenberg et al. |
| 5,715,652 A | 2/1998 | Stahlecker |
| 5,761,054 A | 6/1998 | Kuhn |
| 5,813,113 A | 9/1998 | Stewart et al. |
| 5,858,500 A | 1/1999 | MacPherson |
| 5,880,523 A | 3/1999 | Cadelore |
| 5,988,510 A | 11/1999 | Tuttle et al. |
| 6,121,544 A | 9/2000 | Petsinger |
| 6,195,267 B1 | 2/2001 | MacDonald, Jr. et al. |
| 6,201,296 B1 | 3/2001 | Fries et al. |
| 6,261,215 B1 | 7/2001 | Imer |
| 6,301,096 B1 | 10/2001 | Wozniczka |
| 6,384,397 B1 | 5/2002 | Takiar et al. |
| 6,424,954 B1 | 7/2002 | Leon |
| 6,438,825 B1 | 8/2002 | Kuhm |
| 6,469,625 B1 | 10/2002 | Tomooka |
| 6,473,995 B2 | 11/2002 | Miyakawa et al. |
| 6,512,454 B2 | 1/2003 | Miglioli et al. |
| 6,686,539 B2 | 2/2004 | Farquhar et al. |
| 6,746,960 B2 | 6/2004 | Goodman et al. |
| 6,798,660 B2 | 9/2004 | Moss et al. |
| 6,853,093 B2 | 2/2005 | Cohen et al. |
| 6,879,032 B2 | 4/2005 | Rosenau et al. |
| 6,929,900 B2 | 8/2005 | Farquhar et al. |
| 6,946,960 B2 | 9/2005 | Sisson et al. |
| 6,957,345 B2 | 10/2005 | Cesana et al. |
| 6,970,360 B2 | 11/2005 | Sinha |
| 6,985,362 B2 | 1/2006 | Mori et al. |
| 6,991,961 B2 | 1/2006 | Hubbard et al. |
| 6,996,953 B2 | 2/2006 | Perreault et al. |
| 7,005,733 B2 | 2/2006 | Kommerling et al. |
| 7,015,823 B1 | 5/2006 | Gillen et al. |
| 7,054,162 B2 | 5/2006 | Benson et al. |
| 7,057,896 B2 | 6/2006 | Matsuo et al. |
| 7,094,143 B2 | 8/2006 | Wolm et al. |
| 7,094,459 B2 | 8/2006 | Takahashi |
| 7,095,615 B2 | 8/2006 | Nichols |
| 7,156,233 B2 | 1/2007 | Clark et al. |
| 7,180,008 B2 | 2/2007 | Heitmann et al. |
| 7,189,360 B1 | 3/2007 | Ho et al. |
| 7,214,874 B2 | 5/2007 | Dangler et al. |
| 7,247,791 B2 | 7/2007 | Kulpa |
| 7,304,373 B2 | 12/2007 | Taggart et al. |
| 7,310,737 B2 | 12/2007 | Patel et al. |
| 7,465,887 B2 | 12/2008 | Suzuki et al. |
| 7,475,474 B2 | 1/2009 | Heitmann et al. |
| 7,515,418 B2 | 4/2009 | Straznicky et al. |
| 7,549,064 B2 | 6/2009 | Elbert et al. |
| 7,640,658 B1 | 1/2010 | Pham et al. |
| 7,643,290 B1 | 1/2010 | Narasimhan et al. |
| 7,663,883 B2 | 2/2010 | Shirakami et al. |
| 7,672,129 B1 | 3/2010 | Ouyang et al. |
| 7,731,517 B2 | 6/2010 | Lee et al. |
| 7,746,657 B2 | 6/2010 | Oprea et al. |
| 7,760,086 B2 | 7/2010 | Hunter et al. |
| 7,768,005 B2 | 8/2010 | Condorelli et al. |
| 7,783,994 B2 | 8/2010 | Ball et al. |
| 7,787,256 B2 | 8/2010 | Chan et al. |
| 7,868,411 B2 | 1/2011 | Eaton et al. |
| 7,898,413 B2 | 3/2011 | Hsu et al. |
| 7,901,977 B1 | 3/2011 | Angelopoulos et al. |
| 7,947,911 B1 | 5/2011 | Pham et al. |
| 7,978,070 B2 | 7/2011 | Hunter |
| 8,006,101 B2 | 8/2011 | Crawford |
| 8,084,855 B2 | 12/2011 | Lower et al. |
| 8,094,450 B2 | 1/2012 | Cole et al. |
| 8,101,267 B2 | 1/2012 | Samuels et al. |
| 8,133,621 B2 | 3/2012 | Wormald et al. |
| 8,199,506 B2 | 6/2012 | Janik et al. |
| 8,287,336 B2 | 10/2012 | Dangler et al. |
| 8,325,486 B2 | 12/2012 | Arshad et al. |
| 8,393,918 B2 | 3/2013 | Cheng et al. |
| 8,516,269 B1 | 8/2013 | Hamlet et al. |
| 8,589,703 B2 | 11/2013 | Lee et al. |
| 8,646,108 B2 | 2/2014 | Shiakallis et al. |
| 8,659,506 B2 | 2/2014 | Nomizo |
| 8,659,908 B2 | 2/2014 | Adams et al. |
| 8,664,047 B2 | 3/2014 | Lower et al. |
| 8,716,606 B2 | 5/2014 | Kelley et al. |
| 8,797,059 B2 | 8/2014 | Boday et al. |
| 8,836,509 B2 | 9/2014 | Lowy |
| 8,853,839 B2 | 10/2014 | Gao et al. |
| 8,879,266 B2 | 11/2014 | Jarvis et al. |
| 8,890,298 B2 | 11/2014 | Buer et al. |
| 8,947,889 B2 | 2/2015 | Kelley et al. |
| 8,961,280 B2 | 2/2015 | Dangler et al. |
| 9,003,199 B2 | 4/2015 | Dellmo et al. |
| 9,011,762 B2 | 4/2015 | Seppa et al. |
| 9,052,070 B2 | 6/2015 | Davis et al. |
| 9,166,586 B2 | 10/2015 | Carapelli et al. |
| 9,298,956 B2 | 3/2016 | Wade et al. |
| 9,554,477 B1 | 1/2017 | Brodsky et al. |
| 9,555,606 B1 | 1/2017 | Fisher et al. |
| 9,560,737 B2 | 1/2017 | Isaacs et al. |
| 10,136,519 B2 * | 11/2018 | Brodsky .................. H05K 3/10 |
| 10,143,090 B2 * | 11/2018 | Brodsky .................. H05K 3/10 |
| 2001/0050425 A1 | 12/2001 | Beroz et al. |
| 2001/0056542 A1 | 12/2001 | Cesana et al. |
| 2002/0002683 A1 | 1/2002 | Benson |
| 2002/0068384 A1 | 6/2002 | Beroz et al. |
| 2002/0084090 A1 | 7/2002 | Farquhar |
| 2003/0009684 A1 | 1/2003 | Schwenck et al. |
| 2003/0137416 A1 * | 7/2003 | Fu ........................... G06F 21/86 |
| | | 340/568.1 |
| 2005/0068735 A1 | 3/2005 | Fissore et al. |
| 2005/0111194 A1 | 5/2005 | Sohn et al. |
| 2005/0180104 A1 | 8/2005 | Olesen et al. |
| 2006/0034731 A1 | 2/2006 | Lewis et al. |
| 2006/0049941 A1 | 3/2006 | Hunter et al. |
| 2006/0072288 A1 | 4/2006 | Stewart et al. |
| 2006/0196945 A1 | 9/2006 | Mendels |

(56) References Cited

U.S. PATENT DOCUMENTS

| | | | |
|---|---|---|---|
| 2006/0218779 A1 | 10/2006 | Ooba et al. | |
| 2007/0064396 A1 | 3/2007 | Oman et al. | |
| 2007/0064399 A1 | 3/2007 | Mandel et al. | |
| 2007/0108619 A1 | 5/2007 | Hsu | |
| 2007/0211436 A1 | 9/2007 | Robinson et al. | |
| 2007/0230127 A1 | 10/2007 | Peugh et al. | |
| 2007/0268671 A1 | 11/2007 | Brandenburg et al. | |
| 2008/0050512 A1 | 2/2008 | Lower et al. | |
| 2008/0144290 A1 | 6/2008 | Brandt et al. | |
| 2008/0159539 A1 | 7/2008 | Huang et al. | |
| 2008/0160274 A1 | 7/2008 | Dang et al. | |
| 2008/0191174 A1 | 8/2008 | Ehrensvard et al. | |
| 2008/0251906 A1 | 10/2008 | Eaton et al. | |
| 2009/0073659 A1 | 3/2009 | Peng et al. | |
| 2009/0106563 A1* | 4/2009 | Cherpantier | G06F 21/86 713/194 |
| 2009/0166065 A1 | 7/2009 | Clayton et al. | |
| 2010/0088528 A1 | 4/2010 | Sion | |
| 2010/0110647 A1 | 5/2010 | Hiew et al. | |
| 2010/0177487 A1* | 7/2010 | Arshad | G06F 21/86 361/737 |
| 2010/0319986 A1 | 12/2010 | Bleau et al. | |
| 2011/0001237 A1 | 1/2011 | Brun et al. | |
| 2011/0038123 A1 | 2/2011 | Janik et al. | |
| 2011/0103027 A1 | 5/2011 | Aoki et al. | |
| 2011/0241446 A1 | 10/2011 | Tucholski | |
| 2011/0299244 A1 | 12/2011 | Dede et al. | |
| 2012/0050998 A1* | 3/2012 | Klum | G06F 21/86 361/720 |
| 2012/0117666 A1* | 5/2012 | Oggioni | G06F 21/87 726/34 |
| 2012/0140421 A1 | 6/2012 | Kirstine et al. | |
| 2012/0319986 A1 | 6/2012 | Toh et al. | |
| 2012/0170217 A1 | 7/2012 | Nishikimi et al. | |
| 2012/0185636 A1* | 7/2012 | Leon | H01L 23/576 711/102 |
| 2012/0244742 A1 | 9/2012 | Wertz et al. | |
| 2012/0256305 A1* | 10/2012 | Kaufmann | G06F 21/87 257/659 |
| 2012/0320529 A1 | 12/2012 | Loong et al. | |
| 2013/0033818 A1 | 2/2013 | Hosoda et al. | |
| 2013/0058052 A1 | 3/2013 | Arshad et al. | |
| 2013/0104252 A1 | 4/2013 | Yanamadala et al. | |
| 2013/0141137 A1 | 6/2013 | Krutzik et al. | |
| 2013/0158936 A1 | 6/2013 | Rich et al. | |
| 2013/0170217 A1 | 7/2013 | Lee | |
| 2013/0208422 A1 | 8/2013 | Hughes et al. | |
| 2013/0235527 A1 | 9/2013 | Wagner et al. | |
| 2013/0283386 A1* | 10/2013 | Lee | G06F 21/86 726/26 |
| 2014/0022733 A1 | 1/2014 | Lim et al. | |
| 2014/0160679 A1 | 6/2014 | Kelty et al. | |
| 2014/0184263 A1 | 7/2014 | Ehrenpfordt et al. | |
| 2014/0204533 A1 | 7/2014 | Abeyasekera et al. | |
| 2014/0206800 A1 | 7/2014 | Wu et al. | |
| 2014/0296410 A1 | 10/2014 | Cheng et al. | |
| 2014/0321064 A1 | 10/2014 | Bose et al. | |
| 2014/0325688 A1* | 10/2014 | Cashin | G06F 21/86 726/34 |
| 2015/0007427 A1 | 1/2015 | Dangler et al. | |
| 2015/0163933 A1* | 6/2015 | Steiner | H05K 5/0208 174/50.51 |
| 2015/0199887 A1* | 7/2015 | Rosny | G08B 13/149 324/649 |
| 2015/0235053 A1 | 8/2015 | Lee et al. | |
| 2016/0005262 A1 | 1/2016 | Hirato et al. | |
| 2016/0137548 A1 | 5/2016 | Cabral, Jr. et al. | |
| 2016/0262270 A1 | 9/2016 | Isaacs et al. | |
| 2017/0019987 A1 | 1/2017 | Dragone et al. | |

FOREIGN PATENT DOCUMENTS

| | | |
|---|---|---|
| DE | 19816571 A1 | 10/1999 |
| DE | 19816572 A1 | 10/1999 |
| DE | 10-2012-203955 A1 | 9/2013 |
| EP | 0 056 360 A1 | 10/1993 |
| EP | 0 629 497 A2 | 12/1994 |
| EP | 1 184 773 A1 | 3/2002 |
| EP | 1 207 444 A2 | 5/2002 |
| EP | 1 734 578 A1 | 12/2006 |
| EP | 1 968 362 A2 | 9/2008 |
| EP | 2 104 407 A1 | 9/2009 |
| EP | 1 672 464 B1 | 4/2012 |
| EP | 2 560 467 A1 | 2/2013 |
| JP | 61-297035 A | 12/1986 |
| JP | 2000-238141 A | 9/2000 |
| JP | 2013-125807 A | 6/2013 |
| JP | 2013-140112 A | 7/2013 |
| WO | WO 1999/003675 A1 | 1/1999 |
| WO | WO 1999/021142 A1 | 4/1999 |
| WO | WO 2001/063994 A2 | 8/2001 |
| WO | WO 2003/012606 A2 | 2/2003 |
| WO | WO 2003/025080 A1 | 3/2003 |
| WO | WO 2004/040505 A1 | 5/2004 |
| WO | WO 2009/042335 A1 | 4/2009 |
| WO | WO 2009/092472 A1 | 7/2009 |
| WO | WO 2010/128939 A1 | 11/2010 |
| WO | WO 2013/004292 A1 | 1/2013 |
| WO | WO 2013/0189483 A1 | 12/2013 |
| WO | WO 2014/086987 A2 | 6/2014 |
| WO | WO 2014/158159 A1 | 10/2014 |

OTHER PUBLICATIONS

Clark, Andrew J., "Physical Protection of Cryptographic Devices", Advanced in Cyprtology, Eurocrypt '87, Springer, Berlin Heidelberg (1987) (11 pages).

Halperin et al., "Latent Open Testing of Electronic Packaging", MCMC-194, IEEE (1994) (pp. 83-33).

Simek, Bob, "Tamper Restrictive Thermal Ventilation System for Enclosures Requiring Ventilation and Physical Security", IBM Publication No. IPCOM000008607D, Mar. 1, 1998 (2 pages).

Pamula et al., "Cooling of Integrated Circuits Using Droplet-Based Microfluidics", Association for Computing Machinery (ACM), GLSVLSI'03, Apr. 28-29, 2003 (pp. 84-87).

Saran et al., "Fabrication and Characterization of Thin Films of Single-Walled Carbon Nanotube Bundles on Flexible Plastic Substrates", Journal of the American Chemical Society, vol. 126, No. 14 (Mar. 23, 2004) (pp. 4462-4463).

Khanna P.K. et al., "Studies on Three-Dimensional Moulding, Bonding and Assembling of Low-Temperature-Cofired Ceramics MEMS and MST Applications." Materials Chemistry and Physics, vol. 89, No. 1 (2005) (pp. 72-79).

Drimer et al., "Thinking Inside the Box: System-Level Failures of Tamper Proofing", 2008 IEEE Symposium on Security and Privacy, (Feb. 2008) (pp. 281-295).

Loher et al., "Highly Integrated Flexible Electronic Circuits and Modules", 3rd International IEEE on Microsystems, Packaging, Assembly & Circuits Technology Conference (Oct. 22-24, 2008) (Abstract Only) (1 page).

Sample et al., "Design of an RFID-Based Battery-Free Programmable Sensing Platform", IEEE Transactions on Instrumentation and Measurement, vol. 57, No. 11, Nov. 2008 (pp. 2608-2615).

Jhang et al., "Nonlinear Ultrasonic Techniques for Non-Destructive Assessment of Micro Damage in Material: A Review", International Journal of Prec. Eng. & Manuf., vol. 10, No. 1, Jan. 2009 (pp. 123-135).

Anonymous, "Consolidated Non-Volatile Memory in a Chip Stack", IBM Technical Disclosure: IP.com No. IPCOM000185250, Jul. 16, 2009 (6 pages).

Isaacs et al., "Tamper Proof, Tamper Evident Encryption Technology", Pan Pacific Symposium SMTA Proceedings (2013) (9 pages).

Anonymous, "Selective Memory Encryption", IBM Technical Disclosure: IP.com IPCOM000244183, Nov. 20, 2015 (6 pages).

Zhou et al., "Nonlinear Analysis for Hardware Trojan Detection", ICSPCC2015, IEEE (2015) (4 pages).

Harting Mitronics, "Saftey Caps for Payment Terminals", http://harting-mitronics.ch/fileadmin/hartingmitronics/case_studies/Saftey_caps_for_payment_terminals.pdf, downloaded Aug. 2016 (2 pages).

(56) References Cited

OTHER PUBLICATIONS

Dangler et al., "Tamper-Respondent Sensors with Formed Flexible Layer(s)", U.S. Appl. No. 14/865,551, filed Sep. 25, 2015 (113 pages).
Brodsky et al., "Overlapping, Discrete Tamper-Respondent Sensors", U.S. Appl. No. 14/865,572, filed Sep. 25, 2015 (114 pages).
Dangler et al., "Tamper-Respondent Assemblies with Region(s) of Increased Susceptibility to Damage", U.S. Appl. No. 14/865,591, filed Sep. 25, 2015 (114 pages).
Brodsky et al., "Circuit Boards and Electronic Packages with Embedded Tamper-Respondent Sensor", U.S. Appl. No, 14/865,610, filed Sep. 25, 2015 (43 pages).
Brodsky et al., "Tamper-Respondent Assemblies", U.S. Appl. No. 14/865,632, filed Sep. 25, 2015 (115 pages).
Brodsky et al., "Enclosure with Inner Tamper-Respondent Sensor(s)", U.S. Appl. No. 14/865,651, fled Sep. 25, 2015 (115 pages).
Fisher et al., "Enclosure with Inner Tamper-Respondent Sensor(s) and Physical Security Element(s)", U.S. Appl. No. 14/865,686, filed Sep. 25, 2015 (114 pages).
Brodsky et al., "Tamper-Respondent Assemblies with Bond Protection", U.S. Appl. No. 14/865,708, filed Sep. 25, 2015 (113 pages).
Brodsky et al., "Circuit Layouts of Tamper-Respondent Sensors", U.S. Appl. No. 14/886,179, filed Oct. 19, 2015 (113 pages).
Isaacs, Phillip Duane, "Tamper-Respondent Assembly with Protective Wrap(s) Over Tamper-Respondent Sensor(s)", U.S. Appl. No. 14/918,691, filed Oct. 21, 2015 (40 pages).
Brodsky et al., "Tamper-Respondent Assemblies with Bond Protection", U.S. Appl. No. 14/941,860, filed Nov. 16, 2015 (108 pages).
Fisher et al., "Enclosure with Inner Tamper-Respondent Sensor(s) and Physical Security Element(s)", U.S. Appl. No. 14/941,872, filed Nov. 16, 2015 (109 pages).
Brodsky et al., "Tamper-Respondent Assemblies", U.S. Appl. No. 14/941,887, filed Nov. 16, 2015 (109 pages).
Brodsky et al., "Circuit Boards and Electronic Packages with Embedded Tamper-Respondent Sensors", U.S. Appl. No. 14/941,908, filed Nov. 16, 2015 (41 pages).
Fisher et al., "Tamper-Respondent Assembly with Vent Structure", U.S. Appl. No. 14/955,283, filed Dec. 1, 2015 (61 pages).
Busby et al., "Multi-Layer Stack with Embedded Tamper-Detect Protection", U.S. Appl. No. 15/053,336, filed Feb. 25, 2016 (68 pages).
Campbell et al., "Tamper-Proof Electronic Packages With Two-Phase Dielectric Fluid", U.S. Appl. No. 15/139,503, filed Apr. 27, 2016 (60 pages).
Busby et al., "Tamper-Proof Electronic Packages Formed With Stressed Glass", U.S. Appl. No. 15/154,077, filed May 13, 2016 (45 pages).
Busby et al., "Tamper-Proof Electronic Packages With Stressed Glass Component Substrate(s)", U.S. Appl. No. 15/154,088, filed May 13, 2016 (56 pages).
Brodsky et al., "Circuit Layouts of Tamper-Respondent Sensors", U.S. Appl. No. 15/187,002, filed. Jun. 20, 2016 (110 pages).
Brodsky et al., "Tamper-Respondent Assemblies with Enclosure-to-Board Protection", U.S. Appl. No. 15/193,525, filed Jun. 27, 2016 (54 pages).
Fisher et al., "Applying Pressure to Adhesive Using CTE Mismatch Between Components", U.S. Appl. No. 15/193,556, filed Jun. 27, 2016 (71 pages).
Busby et al., "Tamper-Respondent Assembly with Nonlinearity Monitoring", U.S. Appl. No. 15/194,738, filed Jun. 28, 2016 (48 pages).
Dangler et al., "Tamper-Respondent Sensors with Formed Flexible Layer(s)", U.S. Appl. No. 15/249,663, filed Aug. 29, 2016 (109 pages).
Brodsky et al., "Overlapping, Discrete Tamper-Respondent Sensors", U.S. Appl. No. 15/249,671, filed. Aug. 29, 2016 (109 pages).
Dangler et al., "Tamper-Respondent Assemblies with Region(s) of Increased Susceptibility to Damage", U.S. Appl. No. 15/249,676, filed Aug. 29, 2016 (110 pages).
Dragone et al., "Tamper-Respondent Assembly with Sensor Connection Adapter", U.S. Appl. No. 15/268,959, filed Sep. 19, 2016 (45 pages).
Dragone et al., "Vented Tamper-Respondent Assemblies", U.S. Appl. No. 15/275,748, filed Sep. 26, 2016 (53 pages).
Dragone et al., "Tamper-Respondent Assemblies with In Situ Vent Structure(s)", U.S. Appl. No. 15/275,762, filed Sep. 26, 2016 (72 pages).
Busby et al., "Tamper-Respondent Assemblies with Trace Regions of Increased Susceptibility to Breaking", U.S. Appl. No. 15/341,108, filed Nov. 2, 2016 (56 pages).
Brodsky et al., "Enclosure with Inner Tamper-Respondent Sensor(s)", U.S. Appl. No. 15/409,851, filed. Jan. 19, 2017 (115 pages).
Brodsky et al., "Tamper-Respondent Assemblies with Enclosure-to-Board Protection", U.S. Appl. No. 15/423,833, filed Feb. 3, 2017 (54 pages).

\* cited by examiner

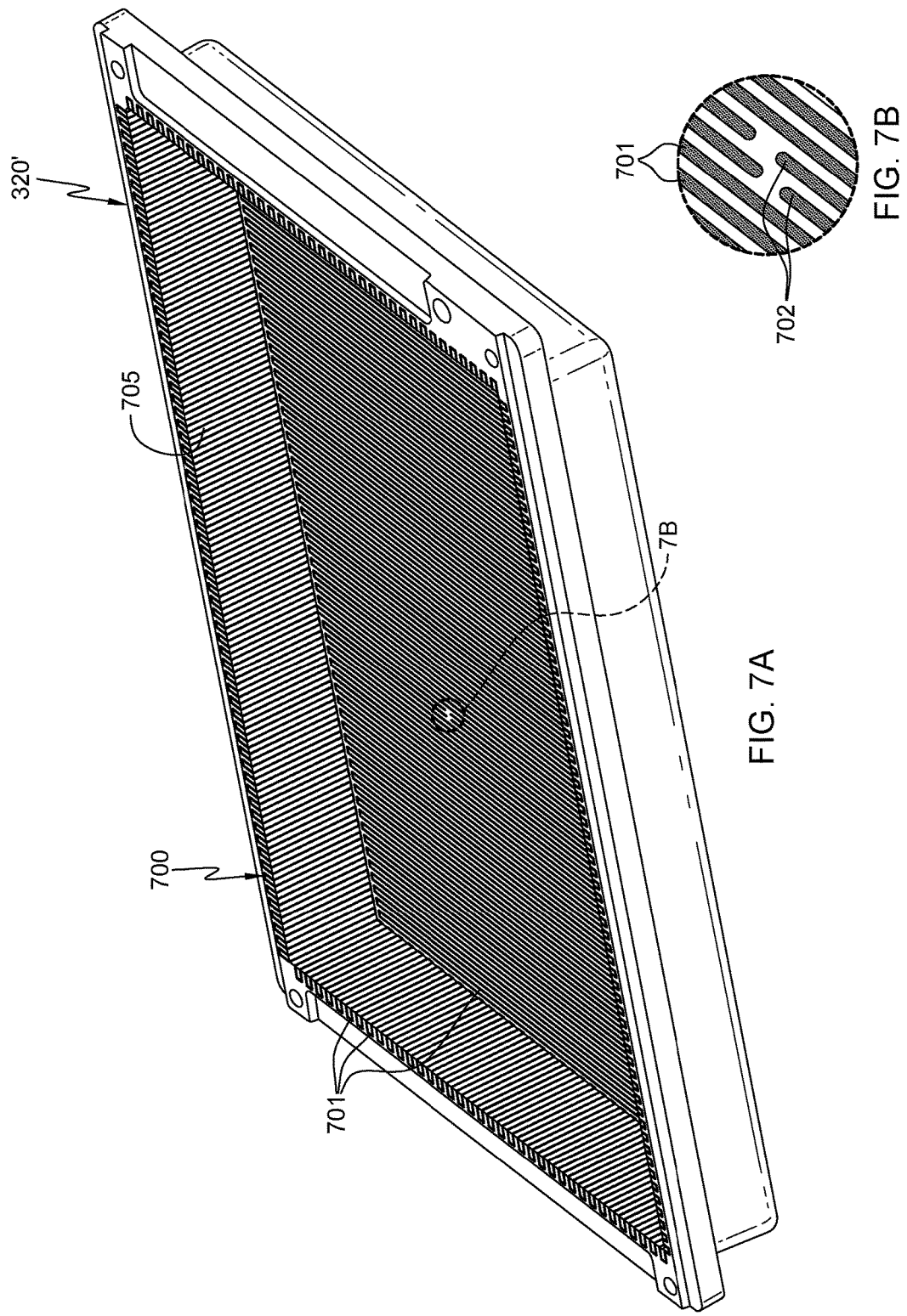

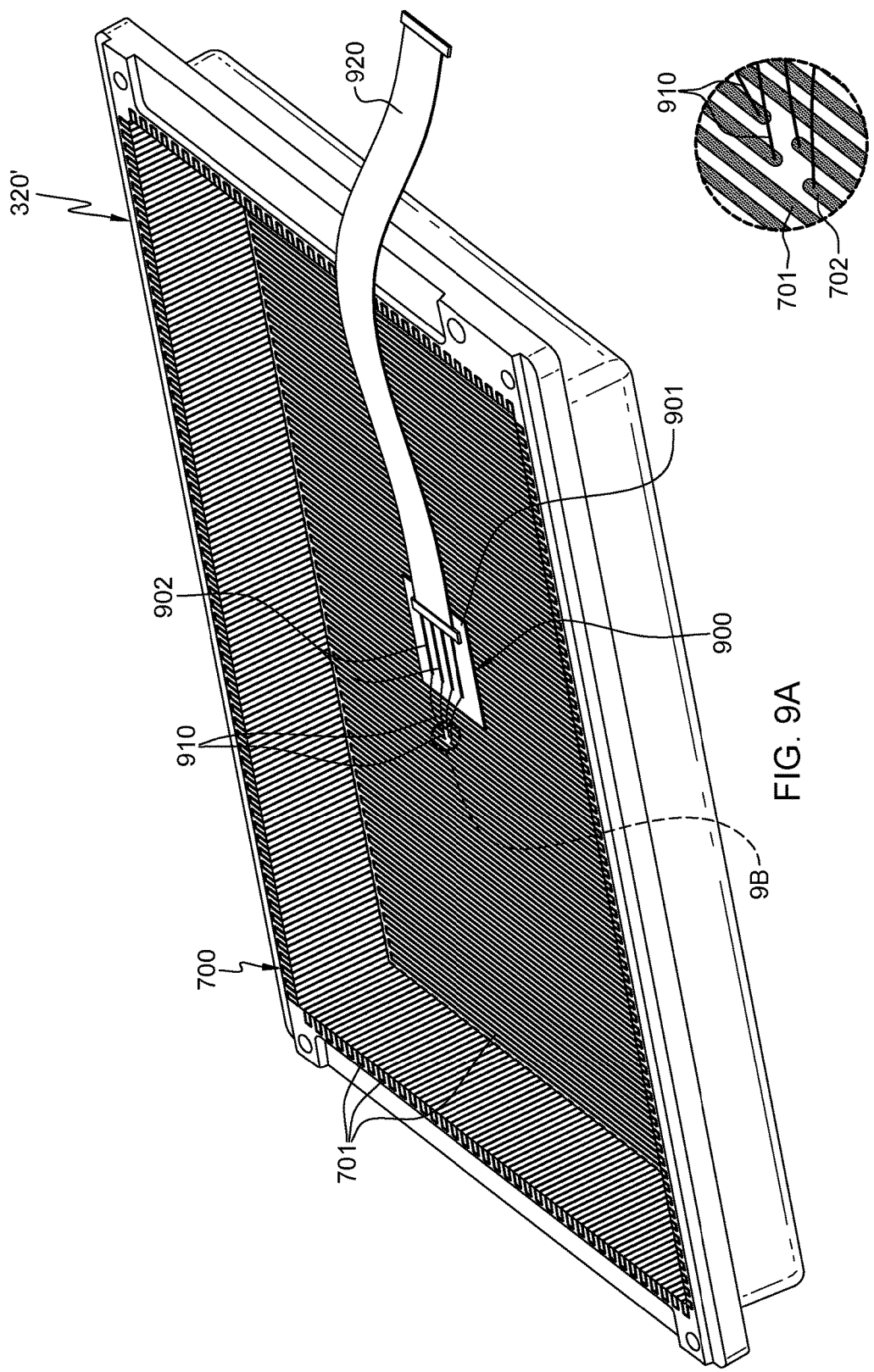

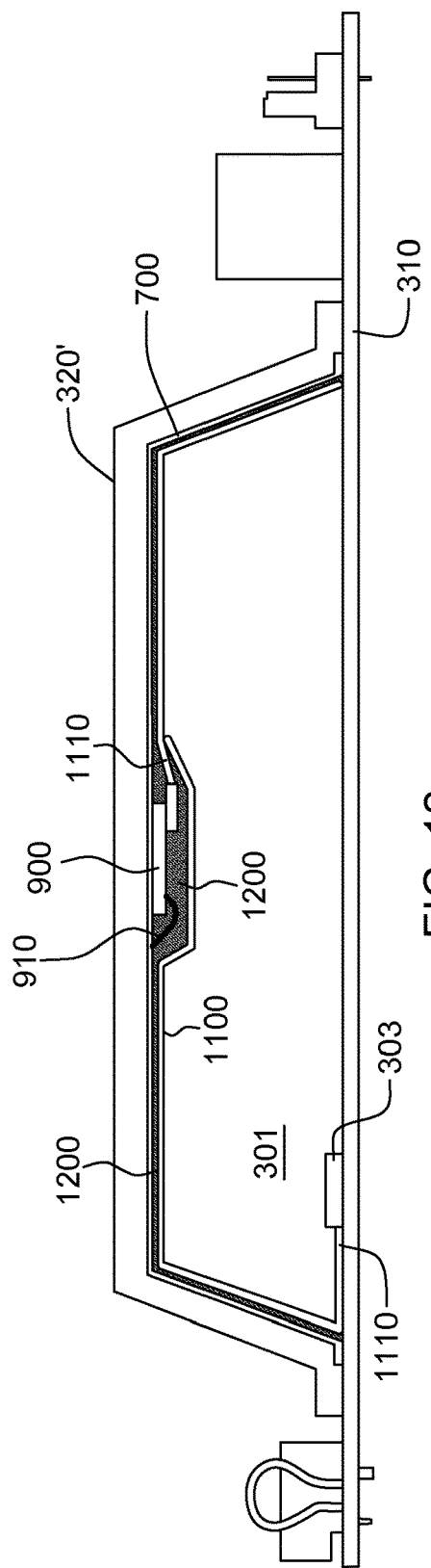

TAMPER-RESPONDENT ASSEMBLY WITH FLEXIBLE TAMPER-DETECT SENSOR(S) OVERLYING IN-SITU-FORMED TAMPER-DETECT SENSOR

BACKGROUND

Many activities require secure electronic communications. To facilitate secure electronic communications, an encryption/decryption system may be implemented on an electronic assembly or printed circuit board assembly that is included in equipment connected to a communications network. Such an electronic assembly is an enticing target for malefactors since it may contain codes or keys to decrypt intercepted messages, or to encode fraudulent messages. To prevent this, an electronic assembly may be mounted in an enclosure, which is then wrapped in a security sensor and encapsulated with polyurethane resin. A security sensor may be, in one or more embodiments, a web or sheet of insulating material with circuit elements, such as closely-spaced, conductive lines fabricated on it. The circuit elements are disrupted if the sensor is torn, and the tear can be sensed in order to generate an alarm signal. The alarm signal may be conveyed to a monitor circuit in order to reveal an attack on the integrity of the assembly. The alarm signal may also trigger an erasure of encryption/decryption keys stored within the electronic assembly.

SUMMARY

Provided herein, in one or more aspects, is a tamper-respondent assembly which includes an enclosure, an in-situ-formed tamper-detect sensor, and one or more flexible tamper-detect sensors. The enclosure encloses, at least in part, one or more electronic components to be protected, and the in-situ-formed tamper-detect sensor is formed over an inner surface of the enclosure. The flexible tamper-detect sensor(s) is disposed over the in-situ-formed tamper-detect sensor, such that the in-situ-formed tamper-detect sensor is between the inner surface of the enclosure and flexible tamper-detect sensor(s). Together the in-situ-formed tamper-detect sensor and the flexible tamper-detect sensor(s) facilitate defining, at least in part, a secure volume about the one or more electronic components.

In one or more other aspects, a tamper-respondent assembly is provided which includes a circuit board, an enclosure, an in-situ-formed tamper-detect sensor, and one or more flexible tamper-detect sensor(s). The enclosure secures to the circuit board and encloses, at least in part, one or more electronic components to be protected, and the in-situ-formed tamper-detect sensor is over an inner surface of the enclosure. The flexible tamper-detect sensor(s) is disposed over the in-situ-formed tamper-detect sensor, such that the in-situ-formed tamper-detect sensor is between the inner surface of the enclosure and the flexible tamper-detect sensor(s). Together, the in-situ-formed tamper-detect sensor and flexible tamper detect sensor(s) facilitate defining, at least in part, a secure volume about the one or more electronic components.

In one or more further aspects, a method of fabricating a tamper-respondent assembly is provided, which includes: providing an enclosure to enclose, at least in part, one or more electronic components to be protected; fabricating an in-situ-formed tamper-detect sensor over an inner surface of the enclosure; forming one or more flexible tamper-detect sensors; and securing the flexible tamper-detect sensor(s) over the in-situ-formed tamper-detect sensor, such that the in-situ-formed tamper-detect sensor is between the inner surface of the enclosure and the flexible tamper-detect sensor(s). Together, the in-situ-formed tamper-detect sensor and the flexible tamper-detect sensor(s) facilitate defining, at least in part, a secure volume about the electronic component(s).

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 7A is an inner isometric view of one embodiment of an enclosure of a tamper-respondent assembly having a tamper-detect sensor formed over the inner surface of the enclosure, in accordance with one or more aspects of the present invention;

FIG. 7B is a partial enlarged depiction of the tamper-respondent assembly of FIG. 7A, taken along line 7B thereof, in accordance with one or more aspects of the present invention;

FIG. 9A is an inner isometric view of the tamper-respondent assembly of FIG. 7A, with a sensor connection adapter shown coupled to the enclosure and disposed over the in-situ formed tamper-detect sensor, in accordance with one or more aspects of the present invention;

FIG. 9B is a partial enlarged depiction of the tamper-respondent assembly of FIG. 9A, taken along line 9B thereof, in accordance with one or more aspects of the present invention;

FIG. 12 is a cross-sectional elevational view of one embodiment of a tamper-respondent assembly with both an in-situ-formed tamper-detect sensor and a flexible tamper-detect sensor(s), in accordance with one or more aspects of the present invention;

DETAILED DESCRIPTION

Aspects of the present invention and certain features, advantages, and details thereof, are explained more fully below with reference to the non-limiting example(s) illustrated in the accompanying drawings. Descriptions of well-known materials, fabrication tools, processing techniques, etc., are omitted so as not to unnecessarily obscure the invention in detail. It should be understood, however, that the detailed description and the specific example(s), while indicating aspects of the invention, are given by way of illustration only, and are not by way of limitation. Various substitutions, modifications, additions, and/or arrangements, within the spirit and/or scope of the underlying inventive concepts will be apparent to those skilled in the art for this disclosure. Note further that reference is made below to the drawings, which are not drawn to scale for ease of understanding, wherein the same reference numbers used throughout different figures designate the same or similar components. Also, note that numerous inventive aspects and features are disclosed herein, and unless otherwise inconsistent, each disclosed aspect or feature is combinable with any other disclosed aspect or feature as desired for a particular application, for instance, for establishing a secure volume about an electronic component(s) or electronic assembly to be protected.

Figure 1:
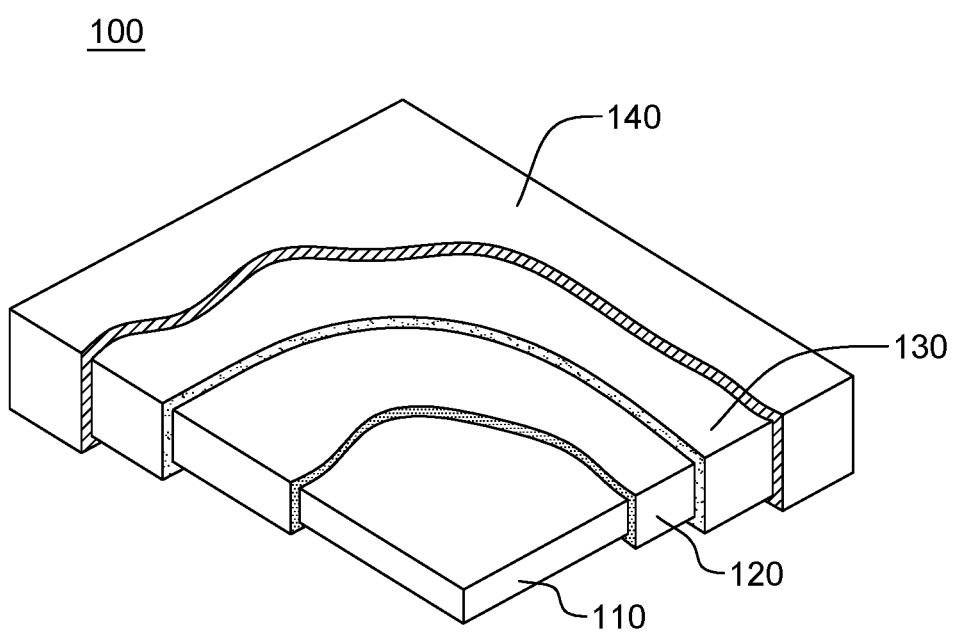
FIG. 1 is a partial cut-away of one embodiment of a tamper-proof electronic package.

Reference is first made to FIG. 1, which illustrates one approach for an electronic package 100 configured as a tamper-proof electronic package for purposes of discussion. In the depicted embodiment, an electronic assembly enclosure 110 is provided containing, for instance, an electronic assembly, which in one embodiment may include a plurality of electronic components, such as an encryption and/or decryption module and associated memory. The encryption and/or decryption module may comprise security-sensitive information with, for instance, access to the information stored in the module requiring use of a variable key, and with the nature of the key being stored in the associated memory within the enclosure.

In one or more implementations, a tamper-proof electronic package or tamper-respondent assembly, such as depicted, is configured or arranged to detect attempts to tamper with or penetrate into electronic assembly enclosure 110. Accordingly, electronic assembly enclosure 110 also includes, for instance, a monitor circuit which, if tampering is detected, activates an erase circuit to erase information stored within the associated memory, as well as the encryption and/or decryption module within the communications card. These components may be mounted on, and interconnected by, a multilayer circuit board, such as a printed circuit board or other multilayer substrate, and be internally or externally powered via a power supply provided within the electronic assembly enclosure.

In the embodiment illustrated, and as one example only, electronic assembly enclosure 110 may be surrounded by a tamper-detect sensor 120, an encapsulant 130, and an outer, thermally conductive enclosure 140. In one or more implementations, tamper-detect sensor 120 may include a tamper-detection laminate that is folded around electronic assembly enclosure 110, and encapsulant 130 may be provided in the form of a molding. Tamper-detect sensor 120 may include various detection layers, which are monitored through, for instance, a ribbon cable by the enclosure monitor, against attempts to penetrate enclosure 110 and damage the enclosure monitor or erase circuit, before information can be erased from the encryption module. The tamper-detect sensor may be, for example, any such article commercially available or described in various publications and issued patents, or any enhanced article such as disclosed herein.

By way of example, tamper-detect sensor 120 may be formed as a tamper-detection laminate comprising a number of separate layers with, for instance, an outermost lamination-detection layer including a matrix of, for example, diagonally-extending or sinusoidally-extending, conductive or semi-conductive lines printed onto a regular, thin insulating film. The matrix of lines forms a number of continuous conductors which would be broken if attempts are made to penetrate the film. The lines may be formed, for instance, by printing conductive traces onto the film and selectively connecting the lines on each side, by conductive vias, near the edges of the film. Connections between the lines and an enclosure monitor of the communications card may be provided via, for instance, one or more ribbon cables. The ribbon cable itself may be formed of lines of conductive material printed onto an extension of the film, if desired. Connections between the matrix and the ribbon cable may be made via connectors formed on one edge of the film. As noted, the laminate may be wrapped around the electronic assembly enclosure to define the tamper-detect sensor 120 surrounding enclosure 110.

In one or more implementations, the various elements of the laminate may be adhered together and wrapped around enclosure 110, in a similar manner to gift-wrapping a parcel, to define the tamper-detect sensor shape 120. The assembly may be placed in a mold which is then filled with, for instance, cold-pour polyurethane, and the polyurethane may be cured and hardened to form an encapsulant 130. The encapsulant may, in one or more embodiments, completely surround the tamper-detect sensor 120 and enclosure 110, and thus form a complete environmental seal, protecting the interior of the enclosure. The hardened polyurethane is resilient and increases robustness of the electronic package in normal use. Outer, thermally conductive enclosure 140 may optionally be provided over encapsulant 130 to, for instance, provide further structural rigidity to the electronic package.

When considering tamper-proof packaging, the electronic package needs to maintain defined tamper-proof requirements, such as those set forth in the National Institutes of Standards and Technology (NIST) Publication FIPS 140-2, which is a U.S. Government Computer Security Standard, used to accredit cryptographic modules. The NIST FIPS 140-2 defines four levels of security, named Level 1 to Level 4, with Security Level 1 providing the lowest level of security, and Security Level 4 providing the highest level of security. At Security Level 4, physical security mechanisms are provided to establish a complete envelope of protection around the cryptographic module, with the intent of detecting and responding to any unauthorized attempt at physical access. Penetration of the cryptographic module enclosure from any direction has a very high probability of being detected, resulting in the immediate zeroization of all plain text critical security parameters (CSPs). Security Level 4 cryptographic modules are useful for operation in physically unprotected environments. Security Level 4 also protects a cryptographic module against a security compromise due to environmental conditions or fluctuations outside the module's normal operating ranges for voltage and temperature. Intentional excursions beyond the normal operating ranges may be used by an attacker to thwart the cryptographic module's defenses. The cryptographic module is required to either include specialized environmental protection features designed to detect fluctuations and zeroize, critical security parameters, or to undergo rigorous environmental failure testing to provide reasonable assurances that the module will not be affected by fluctuations outside the normal operating range in a manner than can compromise the security of the module.

To address the demands for ever-improving anti-intrusion technology, and the higher-performance encryption/decryption functions being provided, enhancements to the tamper-proof, tamper-evident packaging for the electronic component(s) or assembly at issue are desired.

Numerous enhancements are described herein to, for instance, tamper-proof electronic packages or tamper-respondent assemblies. As noted, the numerous inventive aspects described herein may be used singly, or in any desired combination. Additionally, in one or more implementations, the enhancements described herein may be provided to work within defined space limitations for existing packages.

Disclosed hereinbelow with reference to FIGS. 2-14B are various approaches and/or enhancements to creating, for instance, a secure volume for accommodating one or more electronic components, such as one or more encryption and/or decryption modules and associated components of, for instance, a communications card or other electronic assembly to be protected.

Figure 2:
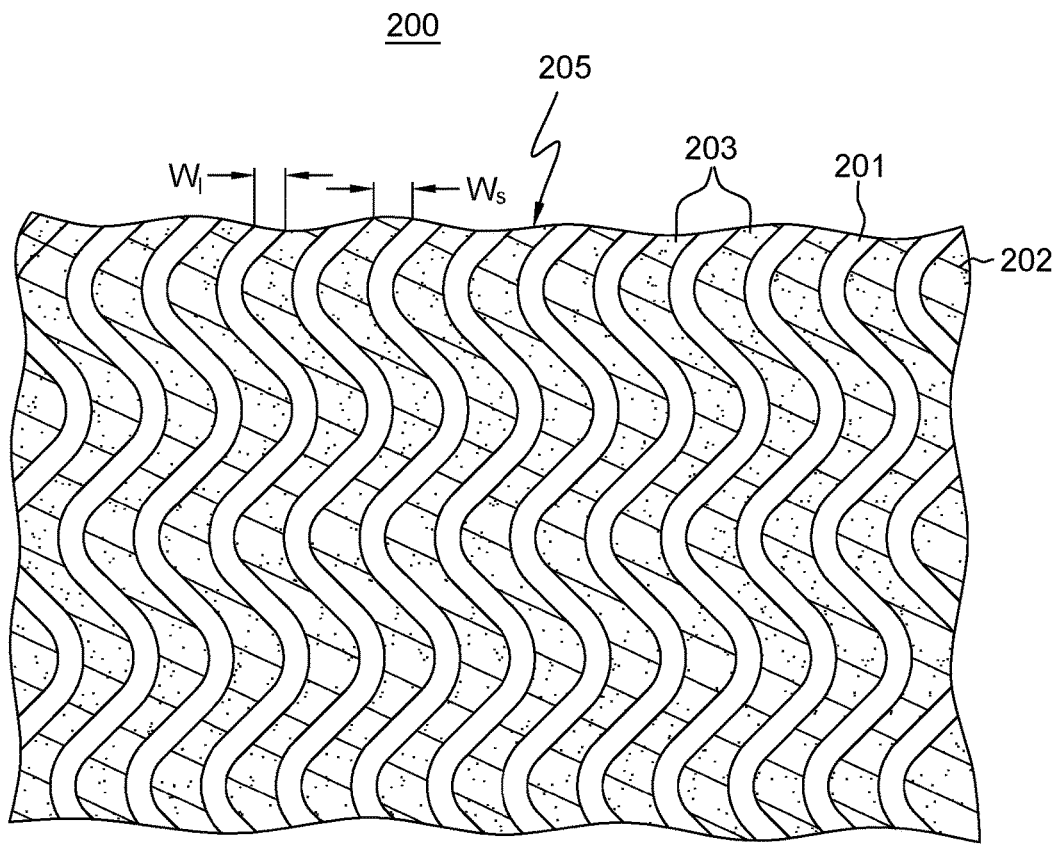
FIG. 2 depicts one embodiment of a tamper-detect sensor with conductive lines forming, at least in part, at least one tamper-detect network, in accordance with one or more aspects of the present invention.

FIG. 2 depicts a portion of one embodiment of a tamper-detection layer 205 (or laser and pierce-respondent layer) of a tamper-detect sensor 200 or security sensor, such as discussed herein. In FIG. 2, tamper-detection layer 205 includes circuit (or sense) lines or traces 201 provided on one or both opposite sides of a flexible layer 202, which in one or more embodiments, may be a flexible insulating layer or film. FIG. 2 illustrates circuit lines 201 on, for instance, one side of flexible layer 202, with the traces on the opposite side of the film being, for instance, the same pattern, but (in one or more embodiments) offset to lie directly below spaces 203, between circuit lines 201. As described below, the circuit lines on one side of the flexible layer may be of a line width $W_1$ and have a pitch or line-to-line spacing $W_s$ such that piercing of the layer 205 at any point results in damage to at least one of the circuit lines traces 201. In one or more implementations, the circuit lines may be electrically connected in-series or parallel to define one or more conductors which may be electrically connected in a network to an enclosure monitor, which may, in one or more implementations, monitor the resistance of the lines. Detection of an increase, or other change, in resistance, caused by cutting or damaging one of the traces, will cause information within the encryption and/or decryption module to be erased. Providing conductive lines 201 in a pattern, such as a sinusoidal pattern, may advantageously make it more difficult to breach tamper-detection layer 205 without detection. Note, in this regard, that conductive lines 201 could be provided in any desired pattern. For instance, in an alternate implementation, conductive lines 201 could be provided as parallel, straight conductive lines, if desired, and the pattern or orientation of the pattern may vary between sides of a layer, and/or between layers.

As noted, as intrusion technology continues to evolve, anti-intrusion technology needs to continue to improve to stay ahead. In one or more implementations, the above-summarized tamper-detect sensor 200 of FIG. 2 may be disposed over an outer surface of an electronic enclosure, such as an electronic enclosure described above in connection with FIG. 1. Alternatively, as described further herein, the tamper-detect sensor may cover or line an inner surface of an electronic enclosure to provide a secure volume about at least one electronic component to be protected. Still further, the tamper-detect sensor, or more particularly, the tamper-detect circuit(s) of the sensor, could be embedded within a multilayer circuit board described below.

In one or more aspects, disclosed herein is a tamper-detect sensor 200 with circuit lines 201 having reduced line widths $W_1$ of, for instance, 200 μm, or less, such as less than or equal to 100 μm, or even more particularly, in the range of 30-70 μm. This is contrasted with conventional trace widths, which are typically on the order of 250 μm or larger. Commensurate with reducing the circuit line width $W_1$, line-to-line spacing width $W_s$ 203 is also reduced to less than or equal to 200 μm, such as less than or equal to 100 μm, or for instance, in a range of 30-70 μm. Advantageously, by reducing the line width $W_1$ and line-to-line spacing $W_s$ of circuit lines 201 within tamper-detect sensor 200, the circuit line width and pitch is on the same order of magnitude as the smallest intrusion instruments currently available, and therefore, any intrusion attempt will necessarily remove a sufficient amount of a circuit line(s) to cause resistance to change, and thereby the tamper intrusion to be detected.

Note that, by making the circuit line width of the smaller dimensions disclosed herein, any cutting or damage to the smaller-dimensioned circuit line will also be more likely to be detected, that is, due to a greater change in resistance. For instance, if an intrusion attempt cuts a 100 µm width line, it is more likely to reduce the line width sufficiently to detect the intrusion by a change in resistance. A change in a narrower line width is more likely to result in a detectable change in resistance, compared with, for instance, a 50% reduction in a more conventional line width of 350 µm to, for instance, 175 µm. The smaller the conductive circuit line width becomes, the more likely that a tampering of that line will be detected.

Note also that a variety of materials may advantageously be employed to form the circuit lines when implemented using resistance monitoring. For instance, the circuit lines may be formed of a conductive ink (such as a carbon-loaded conductive ink) printed onto one or both opposite sides of one or more of the flexible layers 202 in a stack of such layers. Alternatively, a metal or metal alloy could be used to form the circuit lines, such as copper, silver, intrinsically conductive polymers, carbon ink, or nickel-phosphorus (NiP), such as Omega-Ply®, offered by Omega Technologies, Inc. of Culver City, Calif. (USA), or nickel-chrome, such as Ticer™ offered by Ticer Technologies, Chandler, Ariz. (USA). Note that the process employed to form the fine circuit lines or traces on the order described herein is dependent, in part, on the choice of material used for the circuit lines. For instance, if copper circuit lines are being fabricated, then additive processing, such as plating up copper traces, or subtractive processing, such as etching away unwanted copper between trace lines, may be employed. By way of further example, if conductive ink is employed as the circuit line material, fine circuit lines on the order disclosed herein can be achieved by focusing on the rheological properties of the conductive ink formulation. Further, rather than simple pneumatics of pushing conductive ink through an aperture in a stencil with a squeegee, the screen emulsion may be characterized as very thin (for instance, 150 to 200 µm), and a squeegee angle may be used such that the ink is sheared to achieve conductive ink breakaway rather than pumping the conductive ink through the screen apertures. Note that the screen for fine line width printing such as described herein may have the following characteristics in one specific embodiment: a fine polyester thread for both warp and weave on the order of 75 micrometers; a thread count between 250-320 threads per inch; a mesh thickness of, for instance, 150 micrometers; an open area between threads that is at least 1.5× to 2.0× the conductive ink particle size; and to maintain dimensional stability of the print, the screen snap-off is kept to a minimum due the screen strain during squeegee passage.

In a further aspect, the flexible layer 202 itself may be further reduced in thickness from a typical polyester layer by selecting a crystalline polymer to form the flexible layer or substrate. By way of example, the crystalline polymer could comprise polyvinylidene difluoride (PVDF), or Kapton, or other crystalline polymer material. Advantageously, use of a crystalline polymer as the substrate film may reduce thickness of the flexible layer 202 to, for instance, 2 mils thick from a more conventional amorphous polyester layer of, for instance, 5-6 mils. A crystalline polymer can be made much thinner, while still maintaining structural integrity of the flexible substrate, which advantageously allows for far more folding, and greater reliability of the sensor after folding. Note that the radius of any fold or curvature of the sensor is necessarily constrained by the thickness of the layers comprising the sensor. Thus, by reducing the flexible layer thickness to, for instance, 2 mils, then in a four tamper-detection layer stack, the stack thickness can be reduced from, for instance, 20 mils in the case of a typical polyester film, to 10 mils or less with the use of crystalline polymer films.

Figure 3A:
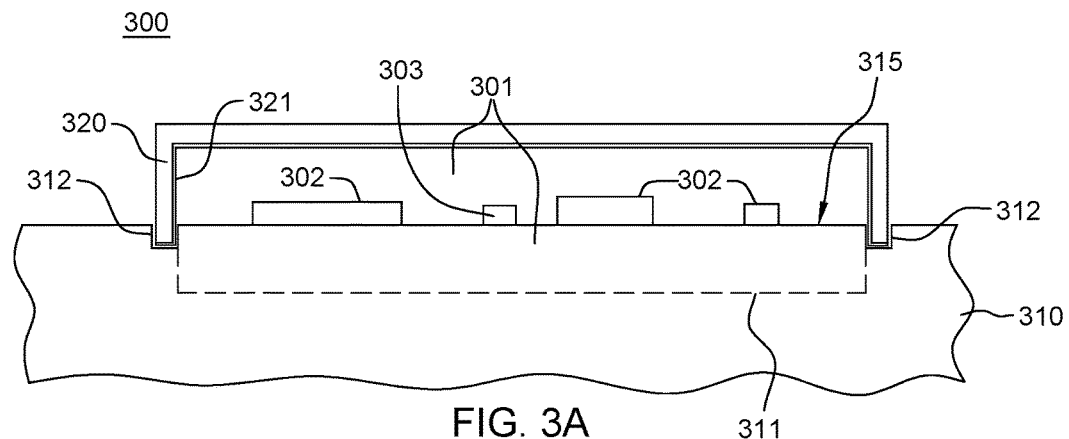
FIG. 3A is a cross-sectional elevational view of another embodiment of a tamper-proof electronic package, or tamper-respondent assembly, which includes (in part) an enclosure, and a multilayer circuit board with an embedded tamper-detect sensor, in accordance with one or more aspects of the present invention.
Figure 3B:
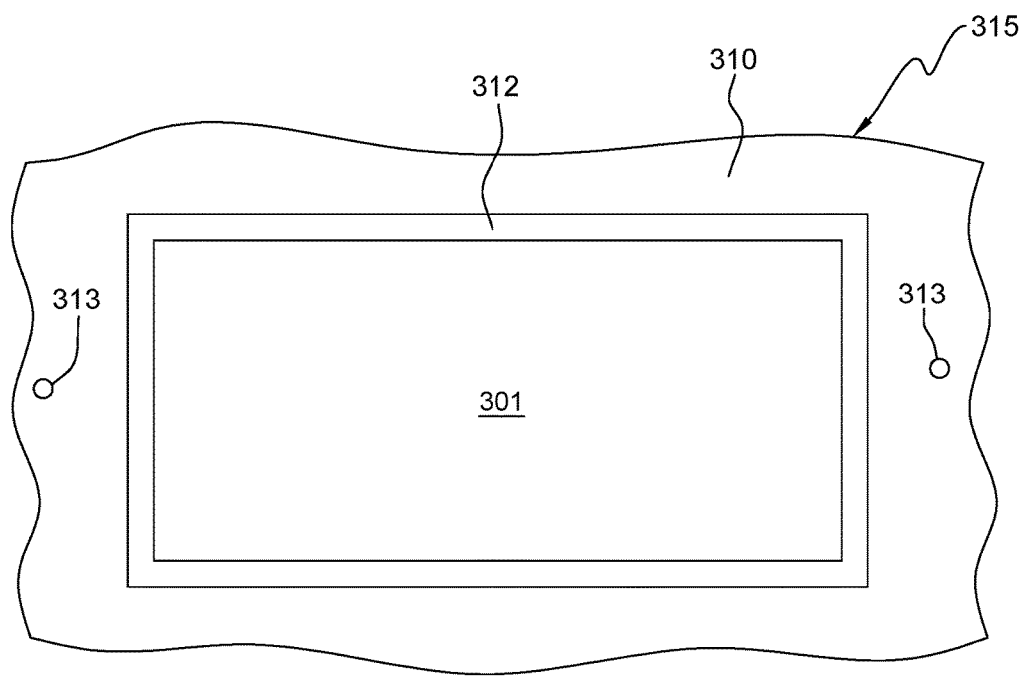
FIG. 3B is a top plan view of the multilayer circuit board of FIG. 3A, depicting one embodiment of the secure volume defined, in part, within the multilayer circuit board, in accordance with one or more aspects of the present invention.

FIGS. 3A & 3B depict one embodiment of a tamper-proof electronic package 300, or tamper-respondent assembly, which comprises one or more electronic components, such as a circuit 315 and/or electronic devices (or elements) 302 to be protected, in accordance with one or more further aspects of the present invention.

Referring collectively to FIGS. 3A & 3B, circuit 315 resides on or is embedded within a multilayer circuit board 310, which also has an embedded tamper-detect sensor 311 that facilitates defining, in part, a secure volume 301 associated with multilayer circuit board 310 that (in one or more embodiments) extends into multilayer circuit board 310. In particular, in the embodiment of FIGS. 3A & 3B, secure volume 301 may exist partially within multilayer circuit board 310, and partially above multilayer circuit board 310. One or more electronic devices 302 are mounted to multilayer circuit board 310 within secure volume 301 and may comprise, for instance, one or more encryption modules and/or decryption modules, and/or associated components, to be protected within the tamper-proof electronic package. In one or more implementations, the one or more electronic components to be protected may comprise, for instance, a secure communications card of a computer system.

Tamper-proof electronic package 300 further includes an enclosure 320, such as a pedestal-type enclosure, mounted to multilayer circuit board 310 within, for instance, a continuous groove (or trench) 312 formed within an upper surface of multilayer circuit board 310, and secured to the multilayer circuit board 310 via, for instance, a structural adhesive disposed within continuous groove 312. In one or more embodiments, enclosure 320 may comprise a thermally conductive material and operate as a heat sink for facilitating cooling of the one or more electronic components 302 within the secure volume. A security mesh or tamper-detect sensor 321 may be associated with enclosure 320, for example, wrapping around the inner surface of enclosure 320, to facilitate defining, in combination with tamper-detect sensor 311 embedded within multilayer circuit board 310, secure volume 301. In one or more implementations, tamper-detect sensor 321 may extend down into continuous groove 312 in multilayer circuit board 310 and may, for instance, even wrap partially or fully around the lower edge of enclosure 320 within continuous groove 312 to provide enhanced tamper detection where enclosure 320 couples to multilayer circuit board 310. In one or more implementations, enclosure 320 may be securely affixed to multilayer circuit board 310 using, for instance, a bonding material such as an epoxy or other adhesive.

Briefly described, tamper-detect sensor 321 may comprise, in one or more examples, one or more tamper-detection layers which include circuit lines or traces provided on one or both sides of a flexible layer, which in one or more implementations, may be a flexible insulating layer or film. The circuit lines on one or both sides of the flexible layer may be of a line width and have a pitch or line-to-line spacing such that piercing of the layer at any point results in damage to one or more of the circuit lines or traces. In one or more implementations, the circuit lines may define one or more conductors which may be electrically connected in a network to an enclosure monitor or detector 303, which monitors, for instance, resistance on the lines, or in the case of conductors, may monitor for a nonlinearity, or non-linear conductivity change, on the conductive lines. Detection of a change in resistance or a nonlinearity caused by cutting or damaging one or more of the lines, will cause information within the secure volume to be automatically erased. The conductive lines of the tamper-detect sensor may be in any desired pattern, such as a sinusoidal pattern, to make it more difficult to breach the tamper-detection layer without detection.

For resistive monitoring, a variety of materials may be employed to form the circuit lines. For instance, the circuit lines may be formed of a metal or metal alloy, such as copper, or silver, or could be formed, for example, of an intrinsically-conductive polymer, carbon ink, or nickel phosphorous (NiP), or Omega-ply®, offered by Omega Technologies, Inc., of Culver City, Calif. (USA), or Ticer™, offered by Ticer Technologies, Chandler, Ariz. (USA). The process employed to form the fine circuit lines or traces is dependent, in part, on the choice of materials used for the circuit lines. For instance, if copper circuit lines are fabricated, then additive processing, such as plating of copper traces, or subtractive processing, such as etching away unwanted copper between trace lines, may be employed.

As noted, in one or more implementations, the circuit lines of the tamper-detect sensor(s) lining the inner surface(s) of enclosure 320, or even printed directly onto one or more layers formed over the inner surface of enclosure 320, may be connected to define one or more detect networks.

If a flexible layer is used over the inner surface of enclosure 320, then the flexible layer may be formed of a crystalline polymer material. For instance, the crystalline polymer could comprise polyvinylidene difluoride (PVDF), or Kapton, or other crystalline polymer material. Advantageously, a crystalline polymer may be made much thinner, while still maintaining structural integrity of the flexible substrate, which also allows for enhanced folding, and greater reliability of the sensor after folding.

As depicted in FIG. 3B, one or more external circuit connection vias 313 may be provided within multilayer circuit board 310 for electrically connecting to the one or more electronic components within secure volume 301. These one or more external circuit connection vias 313 may electrically connect to one or more external signal lines or planes (not shown) embedded within multilayer circuit board 310 and extending, for instance, into a secure base region of (or below) secure volume 301, as explained further below. Electrical connections to and from secure volume 301 may be provided by coupling to such external signal lines or planes within the multilayer circuit board 310.

As noted, secure volume 301 may be sized to house one or more electronic components to be protected, and may be constructed to extend into multilayer circuit board 310. In one or more implementations, multilayer circuit board 310 includes electrical interconnect within the secure volume 301 defined in the board, for instance, for electrically connecting one or more tamper-detection layers of the embedded tamper-detect sensor 311 to associated monitor circuitry also disposed within secure volume 301, along with, for instance, one or more daughter cards, such as memory DIMMs, PCIe cards, processor cards, etc.

Note that the packaging embodiment depicted in FIGS. 3A & 3B is presented by way of example only. Other configurations of enclosure 320, or multilayer circuit board 310 may be employed, and/or other approaches to coupling enclosure 320 and multilayer circuit board 310 may be used. For instance, in one or more alternate implementations, enclosure 320 may be securely affixed to an upper surface of multilayer circuit board 310 (without a continuous groove) using, for instance, a structural bonding material such as an epoxy or other adhesive.

Figure 4:
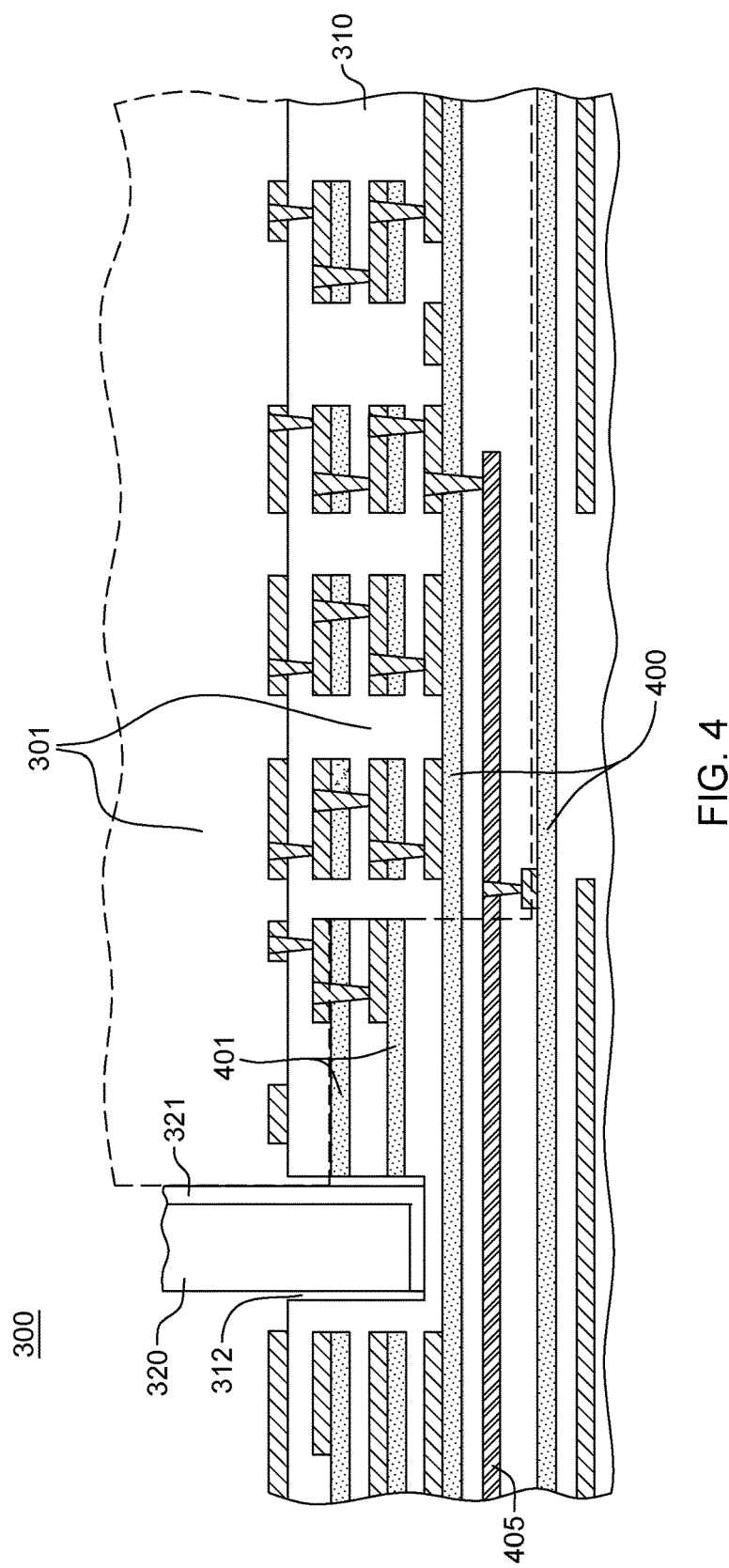
FIG. 4 is a partial cross-sectional elevational view of a more detailed embodiment of the tamper-respondent assembly of FIGS. 3A & 3B comprising (in part) an enclosure and a multilayer circuit board with embedded tamper-detect sensor, in accordance with one or more aspects of the present invention.

By way of further example, FIG. 4 depicts a partial cross-sectional elevational view of a more detailed embodiment of tamper-proof electronic package 300, and in particular, of multilayer circuit board 310, to which enclosure 320 is secured. In this configuration, the embedded tamper-detect sensor includes multiple tamper-detection layers including, by way of example, at least one tamper-detection mat (or base) layer 400, and at least one tamper-detection frame 401. In the example depicted, two tamper-detection mat layers 400 and two tamper-detection frames 401 are illustrated, by way of example only. The lower-most tamper-detection mat layer 400 may be a continuous sense or detect layer extending completely below the secure volume being defined within and/or above multilayer circuit board 310. One or both tamper-detection mat layers 400 below secure volume 301 may be partitioned into multiple circuit zones. Within each tamper-detection mat layer, or more particularly, within each circuit zone of each tamper-detection mat layer, multiple circuits or conductive traces may be provided in any desired configuration. Further, the conductive traces within the tamper-detection layers may be implemented as, for instance, a resistive layer.

As illustrated, one or more external signal lines or planes 405 may enter secure volume 301 between, in one embodiment, two tamper-detection mat layers 400, and then electrically connect upwards into the secure volume 301 through one or more conductive vias, arranged in any desired location and pattern. In the configuration depicted, the one or more tamper-detection frames 401 are disposed at least inside of the area defined by continuous groove 312 accommodating the base of enclosure 320. Together with the tamper-detect sensor(s) 321 associated with enclosure 320, tamper-detection frames 401, and tamper-detection mat layers 400, define secure volume 301, which may extend, in part, into multilayer circuit board 310. With secure volume 301 defined, in part, within multilayer circuit board 310, the external signal line(s) 405 may be securely electrically connected to, for instance, the one or more electronic components mounted to, or of, multilayer circuit board 310 within secure volume 301. In addition, secure volume 301 may accommodate electrical interconnection of the conductive traces of the multiple tamper-detection layers 400, 401, for instance, via appropriate monitor circuitry.

Added security may be provided by extending tamper-detection mat layers 400 (and if desired, tamper-detection frames 401) outward past the periphery of enclosure 320. In this manner, a line of attack may be made more difficult at the interface between enclosure 320 and multilayer circuit board 310 since the attack would need to clear, for instance, tamper-detection mat layers 400, the enclosure 320, as well as the tamper-detection frames 401 of the embedded tamper-detect sensor.

Numerous variations on multilayer circuit board 310 of FIGS. 3A-4 are possible. For instance, in one embodiment, the embedded tamper-detect sensor may include one or more tamper-detection mat layers 400 and one or more tamper-detection frames 401, such as described above, and a tri-plate structure comprising one or more external signal lines or layers sandwiched between an upper ground plane and a lower ground plane. In this configuration, high-speed transfer of signals to and from the secure volume, and in particular, to and from the one or more electronic components resident within the secure volume, would be facilitated.

Note also that, once the secure volume is defined in part within multilayer circuit board 310, conductive vias within the secure volume between layers of multilayer circuit board 310 may be either aligned, or offset, as desired, dependent upon the implementation. Alignment of conductive vias may facilitate, for instance, providing a shortest connection path, while offsetting conductive vias between layers may further enhance security of the tamper-proof electronic package by making an attack into the secure volume through or around one or more tamper-detection layers of the multiple tamper-detection layers more difficult.

The tamper-detection layers of the embedded tamper-detect sensor formed within the multilayer circuit board of the electronic circuit or electronic package may include multiple conductive traces or lines formed between, for instance, respective sets of input and output contacts or vias at the trace termination points. Any pattern and any number of conductive traces or circuits may be employed in defining a tamper-detection layer or a tamper-detection circuit zone within a tamper-detection layer. For instance, 4, 6, 8, etc., conductive traces may be formed in parallel (or otherwise) within a given tamper-detection layer or circuit zone between the respective sets of input and output contacts to those conductive traces.

Figure 5:
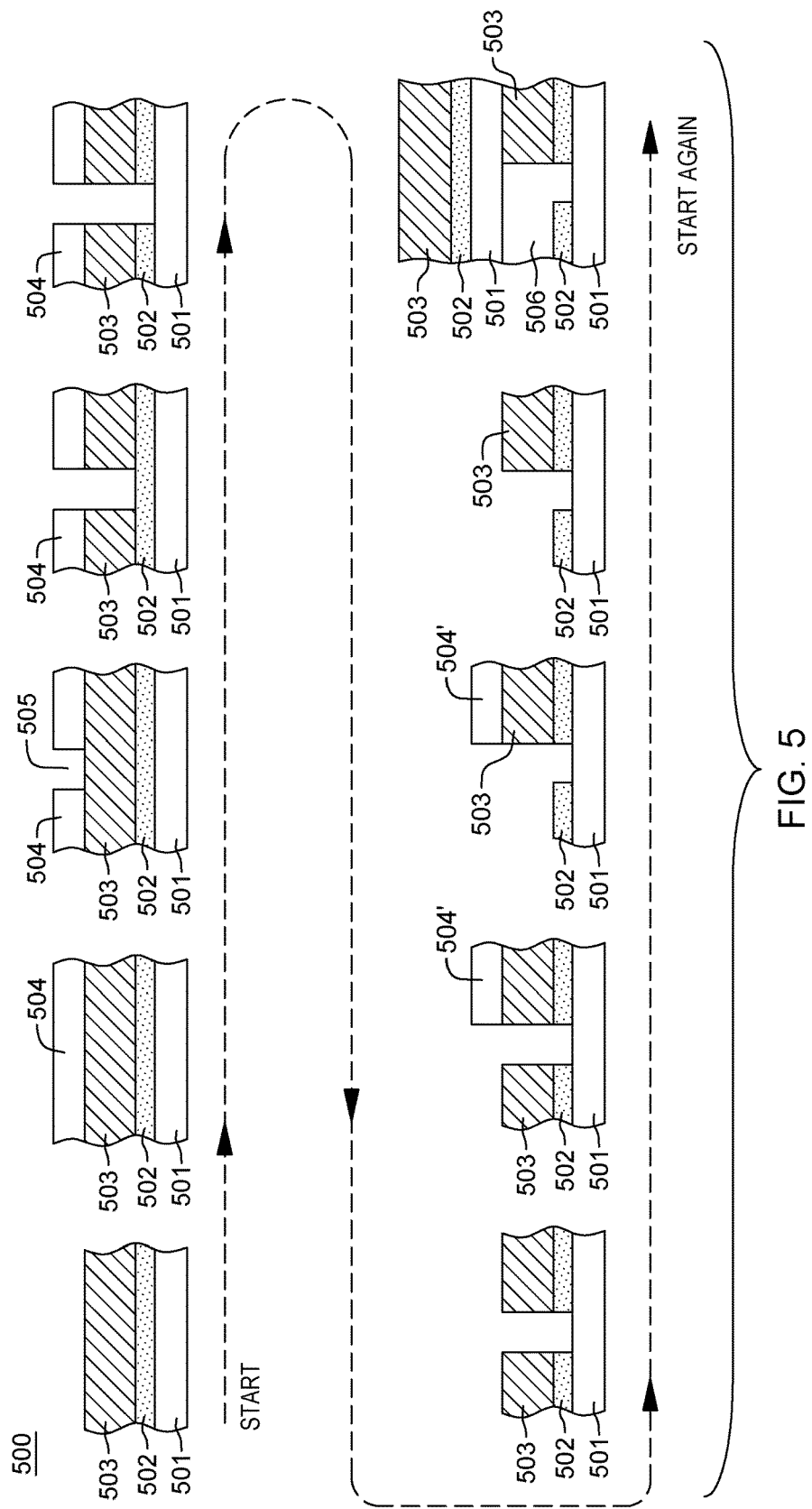
FIG. 5 depicts one embodiment of a process of fabricating a multilayer circuit board with an embedded tamper-detect sensor, in accordance with one or more aspects of the present invention.

In one or more implementations, the multilayer circuit board may be a multilayer wiring board or printed circuit board formed, for instance, by building up the multiple layers of the board. FIG. 5 illustrates one embodiment for forming and patterning a tamper-detection layer within such a multilayer circuit board.

As illustrated in FIG. 5, in one or more implementations, a tamper-detection layer, such as a tamper-detection mat layer or a tamper-detection frame disclosed herein, may be formed within the circuit board by providing a material stack comprising, at least in part, a structural layer 501, such as a pre-preg (or pre-impregnated) material layer, a trace material layer 502 for use in defining the desired trace patterns, and an overlying conductive material layer 503, to be patterned to define conductive contacts or vias electrically connecting to the pattern of traces being formed within the trace material layer 502, for instance, at trace terminal points. In one or more implementations, the trace material layer 502 may comprise nickel phosphorous (NiP), and the overlying conductive layer 503 may comprise copper. Note that these materials are identified by way of example only, and that other trace and/or conductive materials may be used within the build-up 500.

A first photoresist 504 is provided over build-up 500, and patterned with one or more openings 505, through which the overlying conductive layer 503 may be etched. Depending on the materials employed, and the etch processes used, a second etch process may be desired to remove portions of trace material layer 502 to define the conductive traces of the subject tamper-detection layer. First photoresist 504 may then be removed, and a second photoresist 504' is provided over the conductive layer 503 features to remain, such as the input and output contacts. Exposed portions of conductive layer 503 are then etched, and the second photoresist 504' may be removed, with any opening in the layer being filled, for instance, with an adhesive (or pre-preg) 506 and a next build-up layer is provided, as shown. Note that in this implementation, most of overlying conductive layer 503 is etched away, with only the conductive contacts or vias remaining where desired, for instance, at the terminal points of the traces formed within the layer by the patterning of the trace material layer 502. Note that any of a variety of materials may be employed to form the conductive lines or traces within a tamper-detection layer. Nickel-phosphorous (NiP) is particularly advantageous as a material since it is resistant to contact by solder, or use of a conductive adhesive to bond to it, making it harder to bridge from one circuit or trace to the next during an attempt to penetrate into the protected secure volume of the electronic circuit. Other materials which could be employed include OhmegaPly®, offered by Ohmega Technologies, Inc., of Culver City, Calif. (USA), or Ticer™, offered by Ticer Technologies of Chandler, Ariz. (USA).

The trace lines or circuits within the tamper-detection layers, and in particular, the tamper-detection circuit zones, of the embedded tamper-detect sensor, along with the tamper detector monitoring the enclosure, may be electrically connected to detect or compare circuitry provided, for instance, within secure volume 301 (FIG. 3A) of the tamper-proof electronic package. The detect circuitry may include various bridges or compare circuits, and conventional printed wiring board electrical interconnect inside secure volume 301 (FIG. 3A), for instance, located within the secure volume defined by the tamper-detection frames 401 (FIG. 4), and the tamper-detection mat layers 400 (FIG. 4).

Note that advantageously, different tamper-detection circuit zones on different tamper-detection layers may be electrically interconnected into, for instance, the same detect circuitry. Thus, any of a large number of interconnect configurations may be possible. For instance, if each of two tamper-detection mat layers contains 30 tamper-detection circuit zones, and each of two tamper-detection frames contains 4 tamper-detection circuit zones, then, for instance, the resultant 68 tamper-detection circuit zones may be connected in any configuration within the secure volume to create the desired arrangement of circuit networks within the secure volume being monitored for changes in resistance or tampering. Note in this regard, that the power supply or battery for the tamper-detect sensor may be located internal or external to the secure volume, with the sensor being configured to trip and destroy any protected or critical data if the power supply or battery is tampered with.

Figure 6:
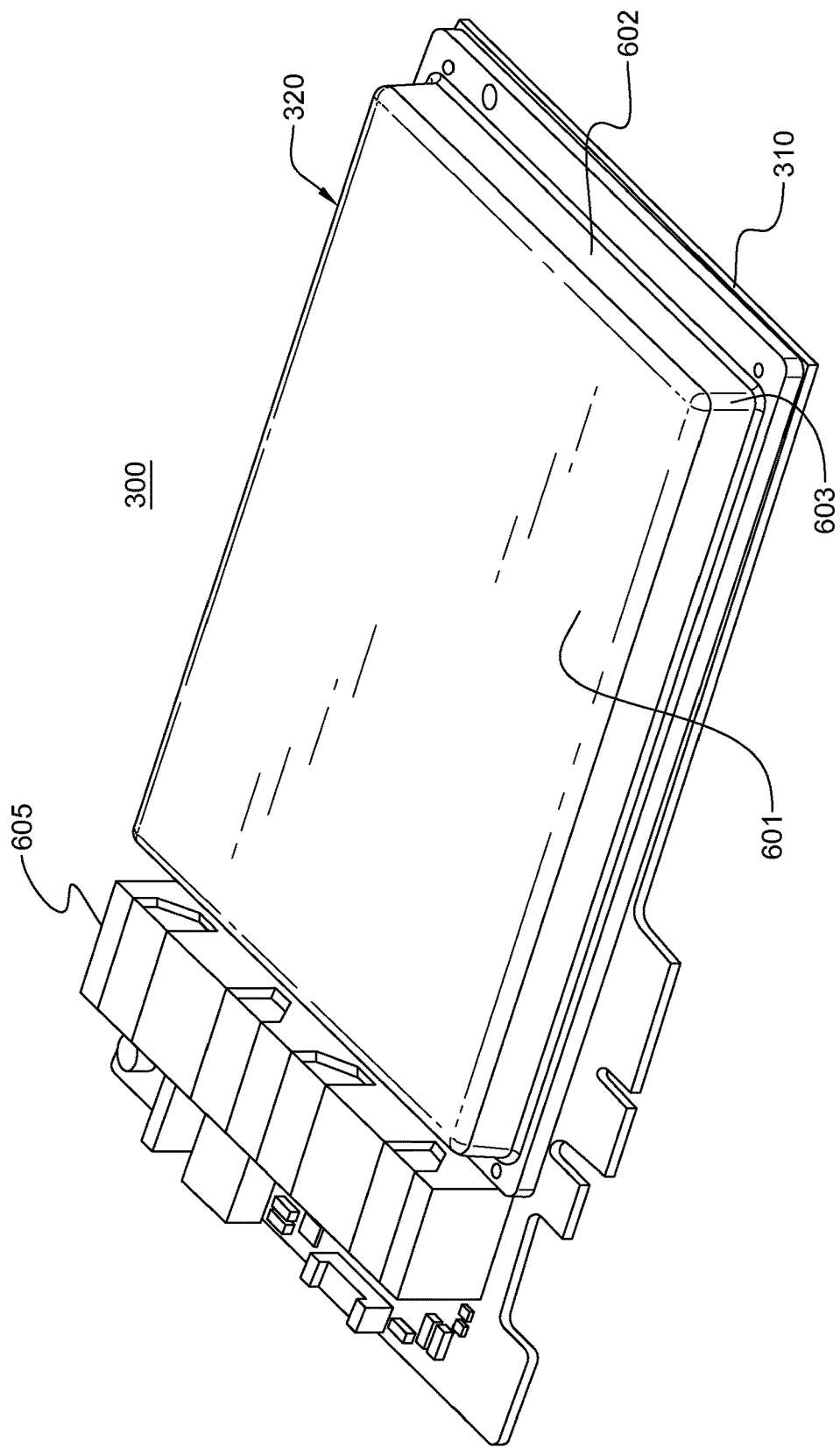
FIG. 6 is an isometric view of one embodiment of a tamper-respondent assembly, in accordance with one or more aspects of the present invention.

By way of further example, an isometric view of one embodiment of a tamper-proof electronic package 300 is depicted in FIG. 6, wherein an enclosure 320 is shown sealed to multilayer circuit board 310 to define a secure volume about one or more electronic components, as described herein. In the embodiment depicted, enclosure 320 may be formed of a thermally conductive material, and includes a main surface 601 and sidewall(s) 602 which include sidewall corners 603. In one or more implementations, an inner surface of enclosure 320, including an inner main surface and an inner sidewall surface corresponding to main surface 601 and sidewall(s) 602 respectively, may be covered, at least in part, by one or more tamper-detect sensors, such as described herein. A power supply 605 or battery for the tamper-detect sensor may be located, as depicted in this embodiment, external to the secure volume, with the tamper detector being configured to trip and destroy any protected or critical data if the power supply or battery is tampered with. Enclosure 320 may be adhered or mechanically affixed to multilayer circuit board 310, which as noted above, may include its own embedded tamper-detect sensor(s).

By way of further enhancement, disclosed herein are additional tamper-respondent assemblies with, in one or more aspects, sensor connection adapters to facilitate electrically connecting a monitor circuit or device to the sensor lines of a tamper-detect sensor, and in particular, to the sensor lines of a tamper-detect sensor disposed over (such as, in situ formed over) an inner surface of an enclosure. More particularly, the sensor connection adapters disclosed herein facilitate electrical connection between the monitor and tamper-detect sensor(s), as well as complement the tamper-detect capability of the assembly. For instance, the sensor connection adapter presented herein may be, in one or more embodiments, a fragile interposer which breaks or separates from the enclosure with an attempted tampering of the assembly at or near the interposer, thereby ensuring breaking of electrical connection between the monitor and the tamper-respondent sensor, and triggering detection of the tamper event.

In general, described hereinbelow are tamper-respondent assemblies and methods of fabrication, which may further incorporate a sensor connection adapter with characteristics that facilitate tamper detection within the tamper-respondent assembly responsive to a tamper event, and particularly, a tamper event contacting, or applying force to the sensor connection adapter. In one or more implementations, the tamper-respondent assembly may include an enclosure, a tamper-detect sensor, a monitor, and a sensor connection adapter. The enclosure is to enclose, at least in part, at least one electronic component to be protected, and the tamper-detect sensor is disposed over an inner surface of the enclosure to facilitate defining a secure volume about the at least one electronic component. The tamper-detect sensor includes sensor lines disposed over the inner surface of the enclosure. The monitor (or monitor circuitry) may be disposed within the secure volume, and monitors the tamper-detect sensor for a tamper event. The sensor connection adapter is coupled to the inner surface of the enclosure, and is disposed over a portion of the tamper-detect sensor within the secure volume. As noted, the sensor connection adapter facilitates electrically connecting the monitor to the sensor lines of the tamper-detect sensor.

As discussed further below, the tamper-detect sensor may be a sensor such as described above in connection with FIGS. 2-3B, or alternatively, may include sensor lines formed in one or more layers disposed in situ, directly on the inner surface of the enclosure. Also, note that the monitor may refer to any monitor circuitry monitoring the tamper-detect sensor for a tamper event, such as the enclosure monitor or detector 303 referenced above in connection with FIG. 3A. In addition, note that although referred to herein as a sensor connection adapter, that more than one sensor connection adapter may be employed in a particular implementation, if desired.

In one or more embodiments, the sensor connection adapter may be an interposer which includes a carrier or substrate with circuit lines, and the carrier resides over a portion of the sensor lines of the tamper-detect sensor. For instance, the carrier may be a friable glass, ceramic, molded plastic carrier, etc., which is relatively weakly adhesively coupled at N discrete points to the inner surface of the enclosure via, for instance, a thermoset material selected or engineered to provide a desired breaking interface of the carrier to the enclosure. In this manner, any tamper event resulting in force being applied against the carrier may readily dislodge the carrier from the inner surface of the enclosure, and in doing so, break one or more of the connectors electrically connecting the sensor connection adapter to the sensor lines of the tamper-detect sensor.

By way of example, in one or more embodiments, the sensor connection adapter includes one or more first connectors which electrically connect the circuit lines of the sensor connection adapter to the sensor lines of the tamper-detect sensor. For instance, the first connector(s) may be an electrical connector type selected from the group consisting of a wire-bond connector, a solder-ball connector, a spring connector, and a zebra-strip connector. Those skilled in the art will recognize, however, that other connector types may alternatively be employed, provided they result in breaking of electrical contact between the sensor connection adapter and the sensor lines of the tamper-detect sensor should, for example, a tamper event result in dislodging of the carrier from the inner surface of the enclosure.

In one or more implementations, the sensor lines of the tamper-detect sensor may have a common line width, and the first connector(s) may have a different (for instance, smaller) width or diameter than the line width of the sensor lines.

In one or more embodiments, the sensor connection adapter may electrically connect to the monitor via, at least in part, one or more second connectors. The second connector(s) may be a different connector type than the first connector(s). By way of example, the second connector(s) may be a ribbon cable connector which electrically couples the adapter to the monitor within the secure volume.

In one or more embodiments, the sensor connection adapter electrically connects to the sensor lines of the tamper-detect sensor via a first set of connectors, and electrically connects to the monitor via, at least in part, a second set of connectors, where the first set of connectors includes a larger number of discrete connectors than the second set of connectors. For instance, in one or more implementations, the circuit lines on the sensor connection adapter may include one or more aspects of the monitor circuitry, such as, for instance, a Wheatstone bridge or other circuitry, which may result in a smaller number of connectors required at the second set of connectors than the first set of connectors.

As described above, in one or more embodiments, the tamper-respondent assembly may also include a multilayer circuit board with an embedded tamper-detect sensor. The tamper-detect sensor disposed over the inner surface of the enclosure, and the embedded tamper-detect sensor within the multilayer circuit board, together facilitate defining the secure volume within which the electronic component(s) resides.

FIGS. 7A & 7B depicts another embodiment of an enclosure 320' for a tamper-proof electronic package, such as described above in connection with FIGS. 2-6. Enclosure 320' facilitates, in one or more embodiments, establishing a secure volume about one or more electronic components to be protected by mounting to, for instance, a multilayer circuit board, such as the multilayer circuit board described above (which as noted, may include one or more embedded tamper-detect sensor(s)). As illustrated, enclosure 320' includes an inner surface 705, such as the depicted inner main surface and inner sidewall surfaces, which are processed (in one or more embodiments) to include sensor lines 701 of a tamper-detect sensor 700 formed in situ in one or more layers deposited onto the inner surface 705 of enclosure 320'. In the illustrated embodiment, sensor line ends 702 (FIG. 7B) are depicted, to which electrical contact is to be made to facilitate connection to a monitor circuit providing, for instance, a DC signal to the sensor lines to monitor the lines for a tamper event. Note that a variety of approaches may be employed to establish sensor lines 701 directly on inner surface 705 of enclosure 320'. For instance, in one or more embodiments, enclosure 320' may be formed of a thermally conductive material, and a dielectric layer may be disposed over inner surface 705, with the sensor lines 701 being formed over, or in part, within, the dielectric layer. One embodiment of such a fabrication process is depicted in FIGS. 8A & 8B.

Figure 8A:
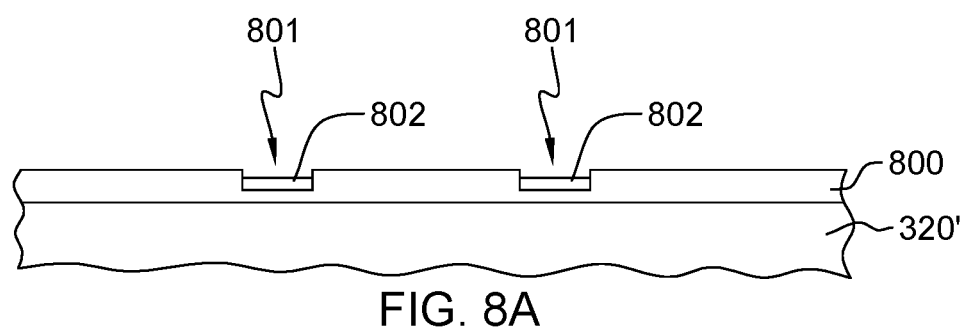
FIGS. 8A & 8B depict one embodiment of a process of fabricating a tamper-detect sensor in-situ over an inner surface of an enclosure of a tamper-respondent assembly, in accordance with one or more aspects of the present invention.
Figure 8B:
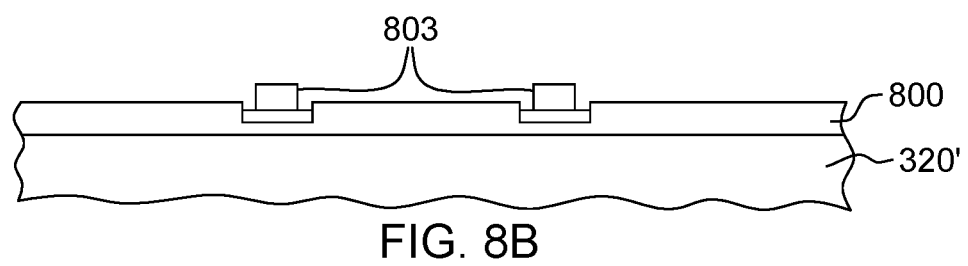

Referring to FIGS. 8A & 8B, a dielectric layer 800 of, for instance, a polyurethane material, may be provided over inner surface 705 of enclosure 320'. In one or more embodiments, laser-direct structuring (LDS) may be used in forming one or more openings 801, which expose seed material 802, such as metal seeds provided within dielectric layer 800. The structure of FIG. 8A may then be, for instance, immersed in a chemical bath to grow sensor lines 803 from seed material 802. By way of specific example, the sensor lines grown might be copper lines or nickel phosphorous lines. Note that using the process of FIGS. 8A & 8B, sensor lines of any desired configuration may be produced, including sensor lines with thicknesses and spacing such as described above, for instance, in connection with FIG. 2. Note also that the fabrication process of FIGS. 8A & 8B is provided by way of example only, and not by way of limitation with respect to the disclosure and claims provided herein. The sensor connection adapter disclosed may be used in combination with an enclosure having any of a variety of tamper-detect sensors formed or disposed over the inner surface of the enclosure in a variety of manners.

FIGS. 9A & 9B depict the partial tamper-respondent assembly of FIGS. 7A & 7B, with a sensor connection adapter 900 coupled to the inner surface of enclosure 320', such as over sensor lines 701 of tamper-detect sensor 700. In one or more embodiments, sensor connection adapter 900 facilitates electrical connection between the monitor of the tamper-respondent assembly and the sensor lines of the tamper-detect sensor. As noted, the monitor may be, by way of example, disposed within the secure volume defined by the tamper-respondent assembly, such as on the multilayer circuit board to which enclosure 320' is to be secured. In the embodiment illustrated, sensor connection adapter 900 includes a carrier 901, with circuit lines 902 disposed on (or within) carrier 901. In one example, carrier 901 may be a thin, rigid substrate or plate formed of, for instance, glass, ceramic, molded plate, etc., and circuit lines 902 may be formed of any conductive material.

In the illustrated embodiment, sensor connection adapter 900 electrically connects to sensor line ends 702 of sensor lines 701 via one or more first connectors 910, and electrically connects to the monitor (not shown) via, at least in part, one or more second connectors 920. Note that as used herein, the first and second connectors may refer to first and second electrical connections, and may be provided as different connector or connection types. For instance, the first connector(s) 910 may each be a connector type such as a wire-bond connector, a solder-ball connector, a spring connector, a zebra-strip connector, etc., and the second connector(s) may be, or be part of, a ribbon cable connector, such as illustrated in FIG. 9A. In implementation, sensor connection adapter 900 advantageously adapts the line width and/or pitch of sensor lines 701 to the line width and/or pitch of the second connector(s) 920.

As noted, second connector 920 may electrically connect to a monitor or tamper detector disposed within the secure volume of the tamper-respondent assembly, such as mounted to an upper surface of the multilayer circuit board to which enclosure 320' may be secured. As illustrated, in one or more embodiments, first connector(s) 910 and second connector(s) 920 may be different connector types. In addition, note that sensor connection adapter 900 may include, for instance, the monitor circuitry or a portion of the monitor circuitry employed in monitoring sensor lines 701 of tamper-detect sensor 700. For instance, sensor connection adapter 900 may include one or more Wheatstone bridges electrically connected between first connector(s) 910 and second connector(s) 920. In such embodiments, the number of first connectors 910 may be larger than the number of second connectors (or second connector lines) 920 connected to sensor connection adapter 900. As noted above, should the monitor detect a tamper event, then the monitor may signal one or more electronic components within the secure volume to destroy any protected or critical data, based on detection of the tamper event.

Advantageously, in one or more implementations, the first connectors 910 may have a different line width, such as a smaller line width, than the line width of the sensor lines 701, and thus, the first connectors may electrically connect to the ends 902 of the respective sensor lines, or even intermediate the ends of the sensor lines (if, for instance, it is desired to establish a voltage divider). In one or more implementations, copper, nickel, or gold wire-bonds may be employed as the first connectors 910.

In one or more embodiments, the first connectors 910 may be chosen with the goal of breaking should a tamper event dislodge sensor connection adapter 900 from the enclosure 320'. By way of example, carrier 901 may be adhesively coupled at N discrete points to the inner surface of the enclosure 320' via a thermoset material. For instance, three discrete points of thermoset material may be provided, with the material being disposed between sensor lines 701, over which carrier 901 resides. If an attempted tamper event applies force to the carrier, or even to the main surface of enclosure 320' (in this example), the force (if sufficiently significant) will dislodge carrier 901, and in doing so, break one or more of the first connectors 910, such that the tamper event may be detected.

Numerous enhancements to the tamper-respondent assembly may be made to facilitate, for instance, breaking of one or more of first connectors 910, second connectors 920, or carrier 901, responsive to an attempted tamper event applying force to the carrier. For instance, sensor lines (not shown) could be provided on the opposite main surface of carrier 901 to the main surface having circuit lines 902. These sensor lines could be similar to sensor lines 701 of tamper-detect sensor 700, and may comprise, for instance, one or more layers deposited onto the surface of carrier 901 in opposing relation to the inner surface of enclosure 320'. These sensor lines would be electrically connected to form part of a tamper-detect sensor associated with carrier 901. In such a case, should an attempted tamper event penetrate enclosure 320' and tamper-detect sensor 700, it would also need to perforate carrier 901 itself if attempted in the region of the carrier. This could involve applying force and/or vibration, or increased temperature, such as with the use of a laser, which would amplify the possibility of disruption of the carrier mounting, and/or the sensor lines on the opposite main surface of carrier 901 in opposing relation to enclosure 320', triggering detection of the tamper event.

As a further enhancement, sensor lines 701 of tamper-detect sensor 700 may be formed so as to be brittle. In such a case, an attempted tamper event involving drilling through enclosure 320' would apply tensile or shear strain to the mount scheme of the carrier (such as a thermoset resin anchoring the carrier to the cover surface, or other plastic/solder material), which may become dislodged from its position by breaking, and in doing so, breaking one or more of the adjacent, brittle sensor lines 701 of tamper-detect sensor 700, irrespective of whether dislodging of carrier 901 also breaks one or more of first connectors 910, or of second connectors 920. Affecting desired mechanical properties of the interface between the carrier anchoring material, and the base material (e.g., polyurethane layer affixed to enclosure 320') or the inscribed sensor lines 701, is a matter of selection of, for instance, a polymer with the desired, specific adhesion properties, either to the polyurethane, or any other resin selected as base material supporting the sensor lines 701. The adhesive strength of the different interfaces can be engineered accordingly to a selected, or desired, breaking interface.

By way of further enhancement, carrier 901 may be engineered to be fragile, being designed to fracture when an external force or load is applied, thus breaking one or more of the electrical interconnections provided by sensor connection adapter 900. By way of example, a fragile carrier may be a pre-engineered carrier, such as a thin glass, quartz, silicon, ceramic, etc., substrate, designed to break with the application of sufficient force or stress. By way of specific example, the carrier could comprise a highly-stressed glass carrier with a compressively-stressed surface layer. For instance, the glass carrier could comprise a machined glass or molded (or cast) glass, stressed using an ion-exchange process. Note in this regard, that the stressed glass may be any friable glass or friable glass ceramic.

In one or more embodiments, the compressively-stressed surface layer(s) may be compressively-stressed or tailored so that the stressed glass fragments into, for instance, glass particles less than 1000 µm in size, such as in the range of 100-1000 µm in size, with an attempted tamper intrusion event through the stressed glass. The fragmentation size of the glass particles may be tailored to ensure that the tamper-respondent detector monitoring the tamper-detect sensor senses the tamper intrusion event. By way of example, the tamper-respondent detector could monitor structural integrity of the stressed glass carrier via a sensor associated with the stressed glass, and the fragmentation size of the glass particles could be sufficient to, for instance, break the sensor, and thereby signal a tamper event. For instance, one or more sensors could be associated with the stressed glass carrier, and be sized, designed or configured to fracture with fragmentation of the stressed glass, thereby, for instance, open-circuiting the sensor and allowing monitor circuitry of or associated with the detector to detect the tamper intrusion event.

Figure 10A:
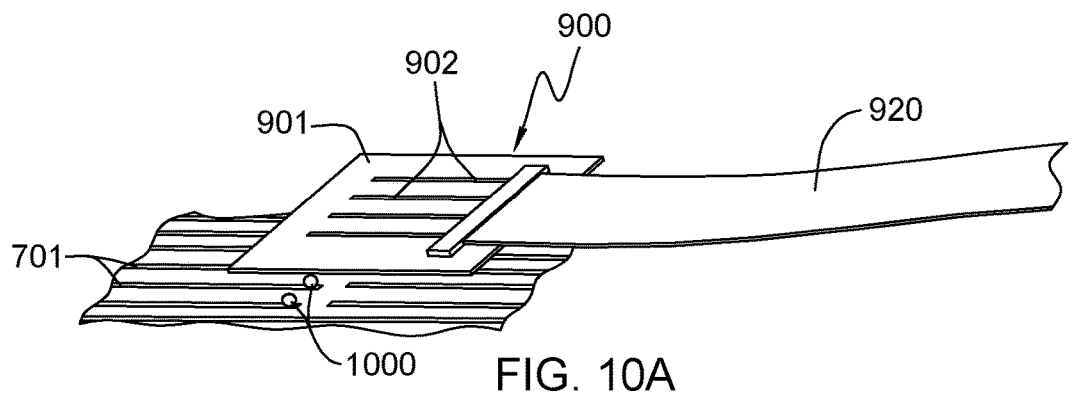
FIG. 10A depicts an alternate embodiment of a sensor connection adapter of a tamper-respondent assembly, in accordance with one or more aspects of the present invention.
Figure 10B:
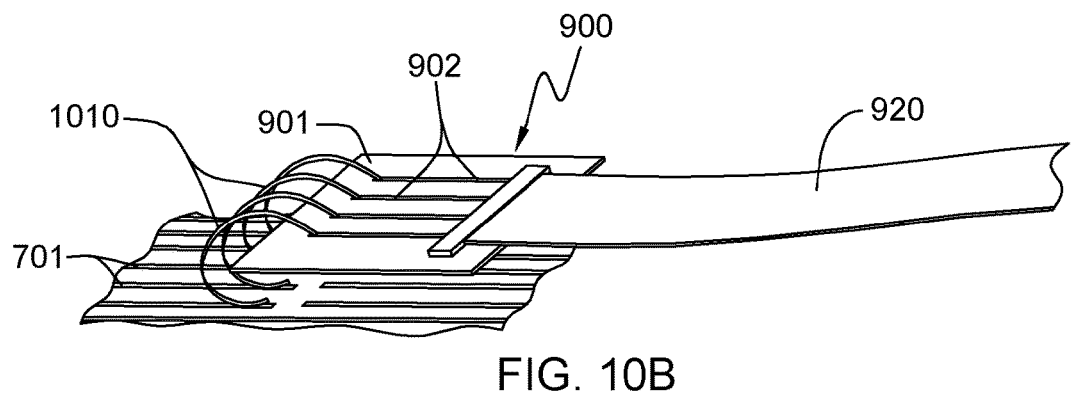
FIG. 10B depicts another alternate embodiment of a sensor connection adapter of a tamper-respondent assembly, in accordance with one or more aspects of the present invention.

FIGS. 10A & 10B depict alternate embodiments of the first connectors for electrically connecting sensor connection adapter 900 to sensor lines 701. As illustrated in FIG. 10A, solder balls 1000 may be employed (in one or more embodiments) to electrically connect sensor lines 701 and circuit lines 902. Note in this regard that a variety of designs may be employed, including placing circuit lines 902 on the main surface of carrier 901 in contact with solder balls 1000, or through substrate vias may be provided within the carrier to electrically connect from one main surface of carrier 901 to the other main surface.

FIG. 10B depicts the sensor connection adapter 900 of FIGS. 9A & 10A, with the first connectors shown in this example as spring-type connectors 1010 electrically connecting sensor lines 701 and to circuit lines 902 of carrier 901. As noted above, other types of connectors may also be employed as first connectors. For instance, zebra strip connectors could be used if desired. A common characteristic of the above-noted connectors is that they may readily break or open circuit with dislodging of sensor connection adapter 900 from the enclosure.

Those skilled in the art will note from the description provided herein that the adapter may be a relatively fragile interposer that may respond to a tamper event at or impacting the adapter by dislodging from, for instance, the enclosure of the tamper-respondent assembly, and in doing so, break one or more of the first connector(s), such as the wire-bonds, solder-balls, or spring connections noted above, with the resultant open circuit being readily detected by the monitor of the tamper-respondent assembly. In this manner, the sensor connection adapter disclosed advantageously builds on the tamper-detect sensing provided by the tamper-detect sensor and monitor circuit by providing a further location or connection that is sensitive to a tamper event. Note also, in one or more enhanced implementation, the sensor connection adapter may be implemented with the monitor logic or circuit disposed on the adapter itself, or a portion of the monitor, as desired.

By way of further example, described hereinbelow are tamper-respondent assemblies and methods of fabrication, which may provide further improved security for one or more components to be protected. As explained below, in these further configurations, a tamper-respondent assembly may include an enclosure to enclose, at least in part, one or more electronic components to be protected, and an in-situ-formed tamper-detect sensor formed over an inner surface of the enclosure. Additionally, one or more flexible tamper-detect sensors are disposed over the in-situ-formed tamper-detect sensor, such that the in-situ-formed tamper-detect sensor is between the inner surface of the enclosure and flexible tamper-detect sensor(s). Together, the in-situ-formed tamper-detect sensor and the flexible tamper-detect sensor(s) facilitate defining, at least in part, a secure volume about the electronic component(s).

In one example, the in-situ-formed tamper-detect sensor may include sensor lines formed in one or more layers disposed in situ, directly on or over the inner surface of the enclosure, such as described above in connection with FIGS. 7A-10B, and the flexible tamper-detect sensor(s) may refer to a sensor such as described above in connection with FIGS. 2-3B.

Numerous enhancements to this further tamper-respondent assembly are described herein. For instance, in one or more embodiments, the flexible tamper-detect sensor(s) may include at least one flexible layer with sensor lines disposed thereon, for instance, as described above in connection with the tamper-detect sensor of FIG. 2. In addition, in one or more embodiments, the in-situ-formed tamper-detect sensor may include metal sensor lines, and the sensor lines of the flexible tamper-detect sensor(s) may be non-metal sensor lines.

In one or more embodiments, a monitor may be provided to monitor the in-situ-formed tamper-detect sensor and the flexible tamper-detect sensor(s) for a tamper event. Further, at least one flexible connect cable may electrically couple to at least one of the in-situ-formed tamper-detect sensor or the flexible tamper-detect sensor(s) to facilitate electrically connecting the monitor to sensor lines of at least one of the in-situ-formed tamper-detect sensor or the flexible tamper-detect sensor(s).

In one or more embodiments, the tamper-respondent assembly may further include a sensor connection adapter, such as the sensor connection adapter described above in connection with FIGS. 9A-10B. By way of example, the sensor connection adapter made be disposed over the in-situ-formed tamper-detect sensor within the secure volume, and may facilitate electrically connecting the monitor to sensor lines of the in-situ-formed tamper-detect sensor. In implementation, the sensor connection adapter may be disposed between the in-situ-formed tamper-detect sensor and the flexible tamper-detect sensor(s). Still further, the sensor connection adapter may electrically connect to the sensor lines of the in-situ-formed tamper-detect sensor via at least one connector. The at least one connector may include a connector type such as a wire-bond connector, a solder-ball connector, a spring connector, or a zebra strip connector.

In one or more implementations, the flexible connect cable electrically couples to the in-situ-formed tamper-detect sensor(s) within the secure volume, and the monitor electrically couples to the in-situ-formed tamper-detect sensor through the at least one flexible connect cable, and through a flexible interposer disposed, at least in part, over the in-situ-formed tamper-detect sensor. For instance, the flexible interposer may include multiple electrical contacts to sensor line contacts of the in-situ-formed tamper-detect sensor, and the sensor line contacts may be dispersed across the in-situ-formed tamper-detect sensor over the inner surface of the enclosure. By way of example, the contacts may be dispersed randomly across the in-situ-formed tamper-detect sensor. Further, in one or more embodiments, the multiple electrical contacts, and conductive traces of the flexible interposer, may be formed of a conductive material invisible to X-ray imagining. In one or more implementations, the flexible tamper-detect sensor(s) may include or embody the flexible interposer, and in one or more other embodiments, the flexible interposer may be disposed between the in-situ-formed tamper-detect sensor and the flexible tamper-detect sensor(s).

Embodiments of the above summarized concepts, as well as other aspects of the present invention, are described further below with reference to FIGS. 11A-14B.

Figure 11A:
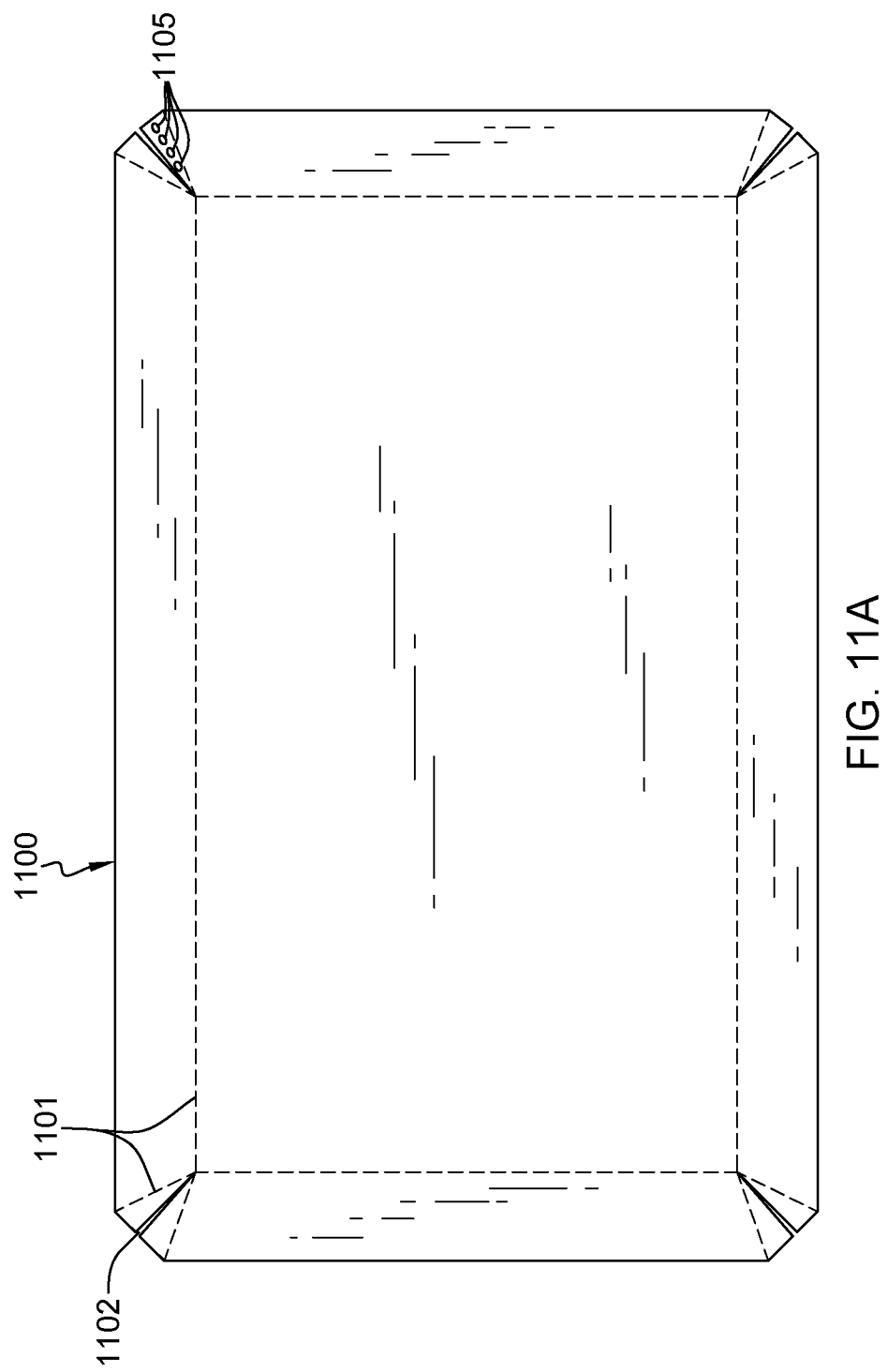
FIG. 11A depicts one embodiment of a flexible tamper-detect sensor for use in another embodiment of a tamper-respondent assembly, in accordance with one or more aspects of the present invention.

FIG. 11A depicts one embodiment of a flexible tamper-detect sensor 1100, in accordance with one or more aspects of the present invention. In one or more embodiments, flexible tamper-detect sensor 1100 may include one or more tamper-detection layers with circuit (or sense) lines or traces on one or both opposite sides of a flexible layer. Further, the flexible layer(s) may be a flexible insulating layer or film, and the sense lines may be conductive lines provided in any desired pattern, such as described in greater detail above in connection with the flexible tamper-detect sensor of FIG. 2.

In one or more implementations, a variety of materials may be employed to form circuit lines implementing, for instance, resistance monitoring. For instance, the circuit lines may be formed of a conductive ink (such as a carbon-loaded conductive ink) printed onto one or both opposite sides of one or more flexible layers in a stack of such layers. Alternatively, other materials, could be used to form the circuit lines, such as a metal (e.g., copper or silver) or metal alloy, as well as transiently conductive polymers, nickel-phosphorus (NiP), such as in the above-noted Omega-Ply, or nickel-chrome (NiCr), such as in the noted Ticer offering. The process and fabrication technology employed to form the fine circuit or sense lines on the flexible layer(s) may be as described above in connection with the embodiment of FIG. 2. Note in this regard that this fabrication technology is distinct from the fabrication technology described above in connection with the tamper-respondent assembly embodiment of FIGS. 7A & 7B, wherein the tamper-respondent sensor is formed in situ in one or more layers deposited onto the inner surface of the enclosure. Thus, in one or more aspects, the in-situ-formed tamper-detect sensor and the flexible tamper-detect sensor(s) discussed herein are fabricated using different technologies, with for instance, the in-situ-formed tamper-detect sensor being formed directly on or in one or more layers deposited on the inner surface of enclosure, and the flexible tamper-detect sensor being separately formed from the enclosure. In one or more embodiments, the flexible tamper-detect sensor(s) may be adhesively secured over the inner surface of the enclosure, including over the in-situ-formed tamper-detect sensor. One embodiment of such an assembly is depicted in FIG. 11B.

Figure 11B:
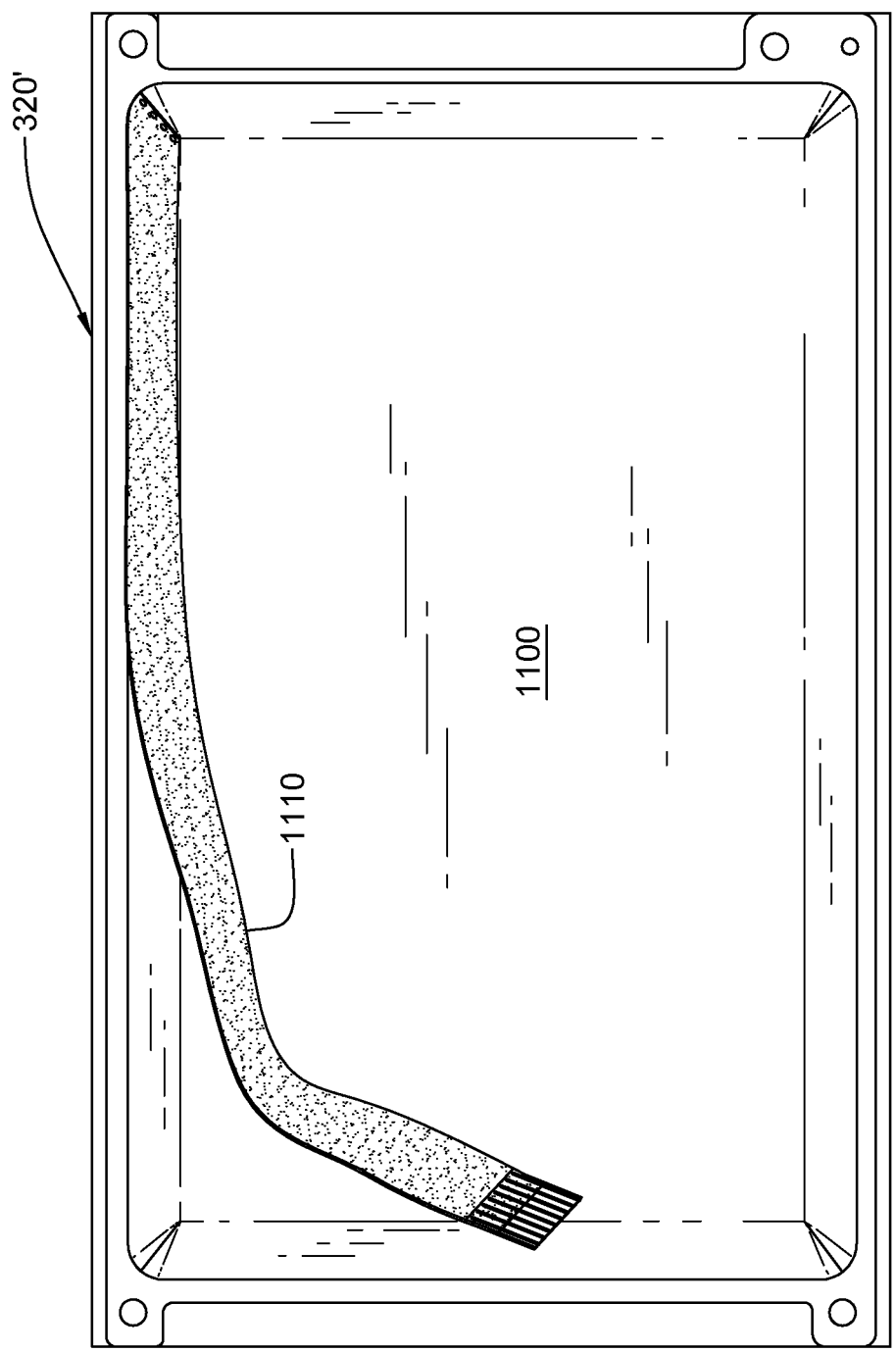
FIG. 11B depicts the partial tamper-respondent assembly of FIG. 7A with the flexible tamper-detect sensor of FIG. 11A lining the enclosure over the in-situ-formed tamper-detect sensor, and showing the tamper-respondent assembly with a flexible connect cable to facilitate electrical connection of a monitor to the sensor(s), in accordance with one or more aspects of the present invention.

Referring collectively to FIGS. 11A & 11B, one embodiment of a flexible tamper-detect sensor 1100 is illustrated, which is sized and configured to line the inner surface of enclosure 320' of the tamper-respondent assembly. In the depicted embodiment, flexible tamper-detect sensor 1100 may include extra material in the corners for overlapping when lining the inner surface of the enclosure. Further, fold lines 1101 may be provided, depending on the configuration of the enclosure, to assist with folding the sensor to line the inner surface of the enclosure 320'. As illustrated in FIG. 11A, a slit 1102 may be provided to allow for overlapping of flexible tamper-detect sensor material at the inner corners of the enclosure when positioned to overlay the inner surface of the enclosure, as depicted in FIG. 11B.

Figure 14A:
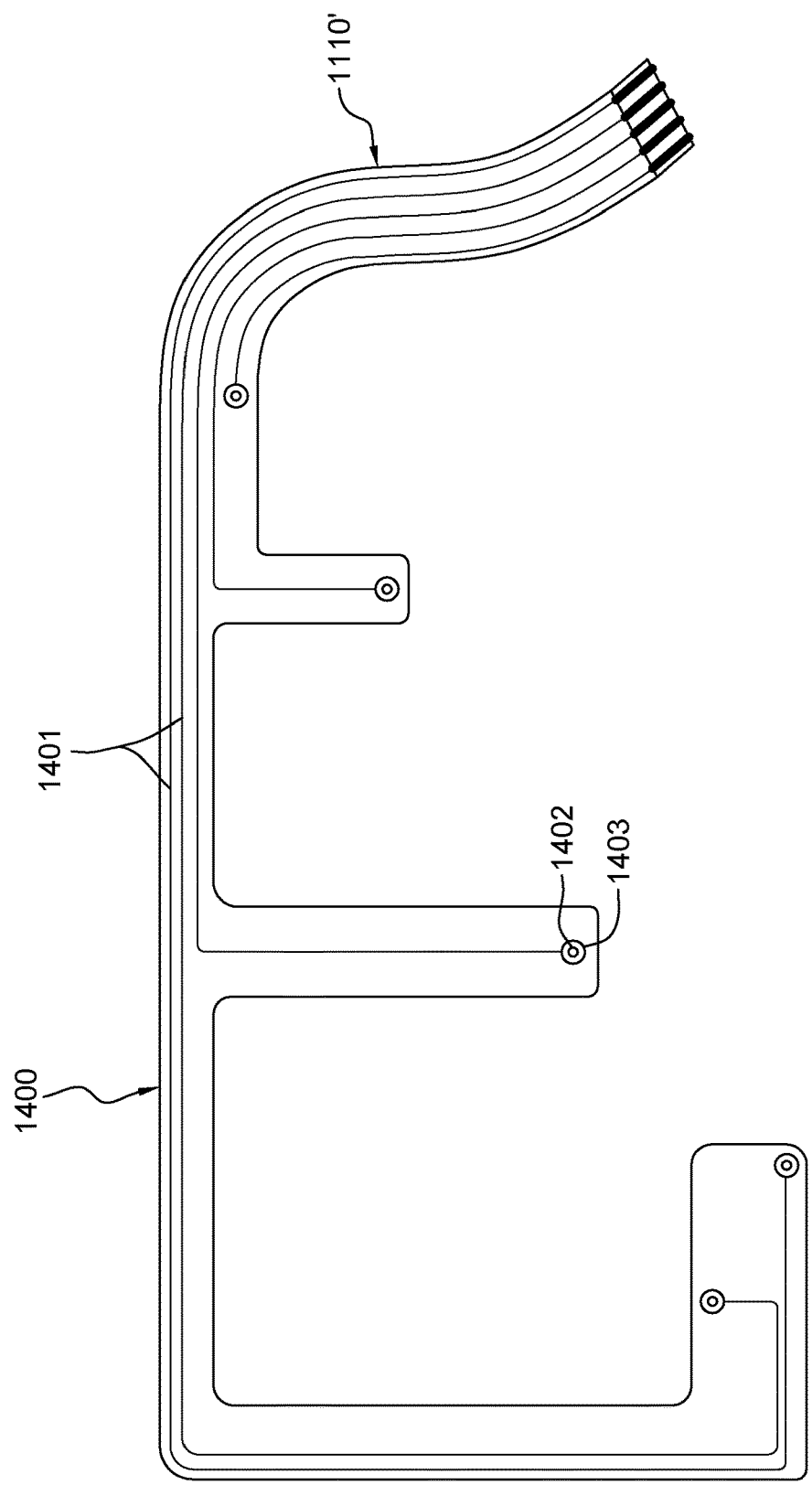
FIG. 14A is a partial depiction of a flexible interposer with distributed electrical contacts to the underlying in-situ-formed tamper-detect sensor, in accordance with one or more aspects of the present invention.

As illustrated in FIG. 11A, one or more contact pads 1105 may be provided on or within flexible tamper-detect sensor 1100 to facilitate electrical connection of a connect cable, such as flexible connect cable 1110 (FIG. 11B), to the tamper-detect sensor 1100 for, for instance, electrically connecting the sensor to a monitor (e.g., monitor circuitry) within the secure volume. Further, although not shown, a separate flexible connect cable could also be provided electrically coupled to sense lines of the in-situ-formed tamper-detect sensor beneath the flexible tamper-detect sensor(s). Where present, the further flexible connect cable could feed through the flexible tamper-detect sensor(s) 1100 in one of the corners of the assembly through the sensor material overlap in that corner. As explained further below, in one or more embodiments, the further flexible connect cable could electrically connect to sense lines of the in-situ-formed tamper-detect sensor via a sensor connection adapter, such as illustrated in FIG. 12, and described further below, or via a flexible interposer, such as illustrated in FIG. 14A, and described further below.

Those skilled in the art will note that, although illustrated as a single flexible tamper-detect sensor 1100, multiple flexible tamper-detect sensors could be provided. For instance, an inner sidewall tamper-respondent sensor may be provided for disposition over the inner sidewall surface of the enclosure, and an inner main surface tamper-respondent sensor could be provided for disposition, at least in part, over the inner main surface of the enclosure, with the inner sidewall tamper-respondent sensor and inner main surface tamper-respondent sensor being discrete, tamper-respondent sensors that overlap, at least in part, and facilitate defining the secure volume for the electronic component(s) to be protected.

Note again that with the configuration of FIGS. 11A & 11B, multiple different types of tamper-detect sensor technologies are employed, with the in-situ-formed tamper-detect sensor being a rigid sensor formed on or within layers deposited over the inner surface of the enclosure, and the one or more flexible tamper-detect sensors being, for instance, formed of flexible layers (with sensor lines) that are adhesively secured to the inner surface of the enclosure, such that the in-situ-formed tamper-detect sensor resides between the inner surface of the enclosure and the flexible tamper-detect sensor(s). One embodiment of this assembly is depicted in the cross-sectional elevational view of FIG. 12.

As illustrated in FIG. 12, enclosure 320' of the tamper-respondent assembly may be mounted or secured to a multilayer circuit board 310, which may have an embedded tamper-respondent sensor such as described above in connection with FIGS. 3A & 3B. As discussed, the embedded tamper-respondent sensor facilitates defining, in part, a secure volume 301 associated with multilayer circuit board 310. In the illustrated embodiment, both an in-situ-formed tamper-detect sensor 700 and one or more flexible tamper-detect sensors 1100 are provided over the inner surface of enclosure 320'. As discussed, in-situ-formed tamper-detect sensor 700 may be formed within one or more layers deposited onto the inner surface of enclosure 320', and in operation, an electrical signal such as a DC signal, is provided to sense lines of the in-situ-formed tamper-detect sensor 700 to monitor the lines for a tamper event. One or more flexible connector cables 1110 may be provided to facilitate electrically coupling monitor 303 to sense lines of the in-situ-formed tamper-detect sensor 700, as well as to sense lines of flexible tamper-detect formed tamper-detect sensor 1100.

In one or more implementations, one or more of the flexible connect cables may be formed as a flex ribbon cable or extension, such as depicted in FIG. 11B for the flexible tamper-detect sensor 1100.

Further, in the depicted embodiment, a sensor connection adapter 900 is provided to facilitate electrical connection to sense lines of the in-situ-formed tamper-detect sensor 700. In one or more implementations, sensor connection adapter 900 may be configured and have connectors 910 such as described above in connection with the embodiments of FIGS. 9-10B. An adhesive 1200, such as an epoxy, may be disposed between the flexible tamper-detect sensor 1100 and inner surface of enclosure 320' with the in-situ-formed detect sensor 700 so as to secure the flexible tamper detect sensor(s) 1100 as a liner over the inner surface of enclosure 320'.

Advantageously, by incorporating one or more flexible tamper-detect sensors (such as described) and an in-situ-formed tamper-detect sensor (such as described) over the inner surface of the enclosure, significantly improved package security is attained compared, for instance, with using the in-situ-formed tamper-detect sensor technology only. Further, combining the different fabrication technologies described herein makes gaining entry into the secure volume of the tamper-proof package more difficult due to the fact that an intruder would need to gain access through different layers of different technologies of tamper-detect sensors. Another benefit of coupling the two disparate sensor fabrication technologies together is that it provides the ability to reduce the number of layers within the flexible tamper-detect sensor, while still maintaining good security for the package. Reducing the number of tamper-detection layers within the flexible tamper-detect sensor advantageously improves thermal transfer through the sensor(s) for cooling, lowers cost, improves manufacturability and eliminates the need for multiple distinct flexible tamper-respondent sensors. That is, by making the flexible tamper-respondent sensor thinner, a single piece solution, as described herein, may be used in place of a two piece solution. Any security gaps, for instance in the corners of the enclosure, are inherently covered by the sense lines of the underlying in-situ-formed tamper-detect sensor, thus allowing use of a single flexible tamper-respondent sensor over the inner surface of the enclosure.

Figure 13:
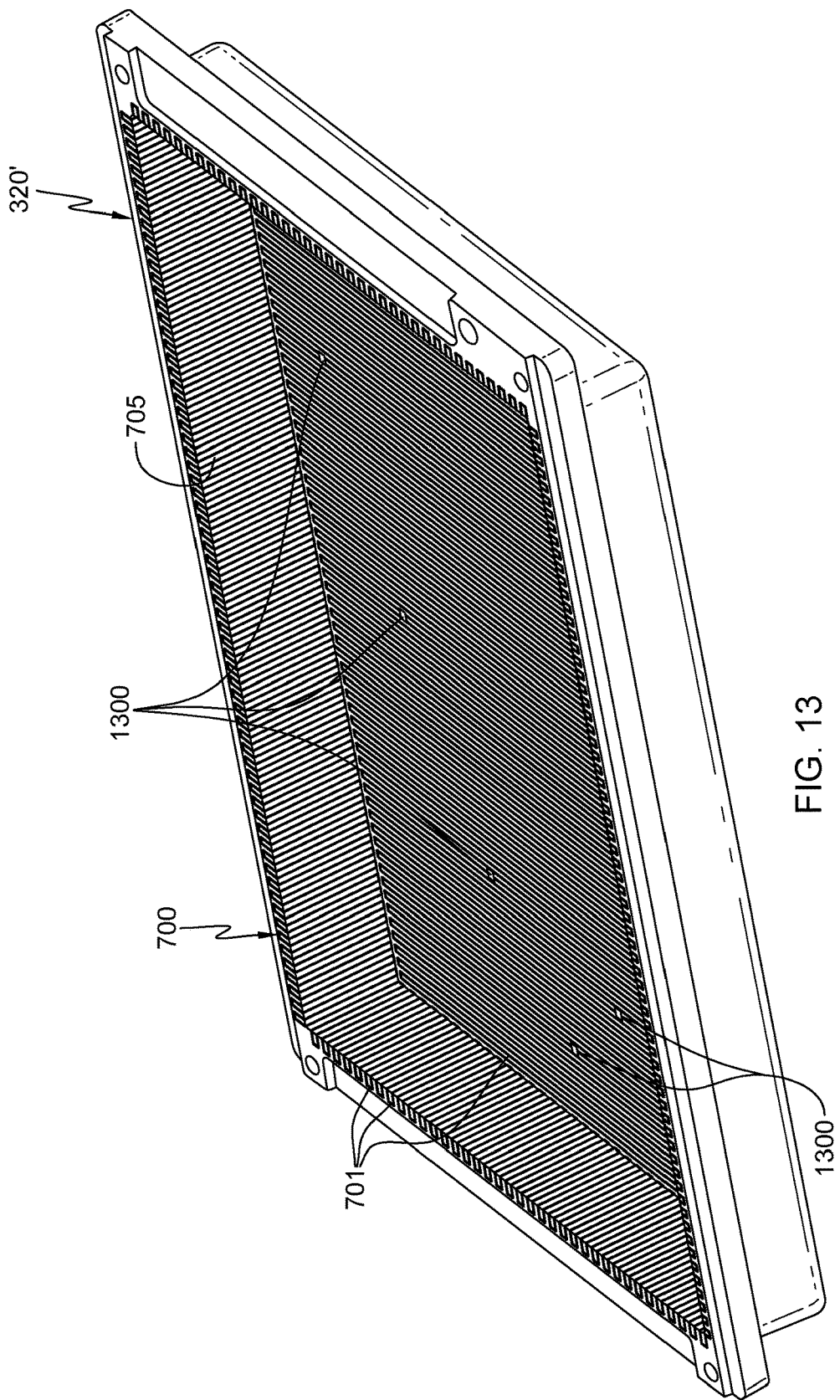
FIG. 13 depicts one embodiment of a partial tamper-respondent assembly with an enclosure and in-situ-formed tamper-detect sensor over an inner surface thereof, and having distributed sense line contacts, contact pads, in accordance with one or more aspects of the present invention.
Figure 14B:
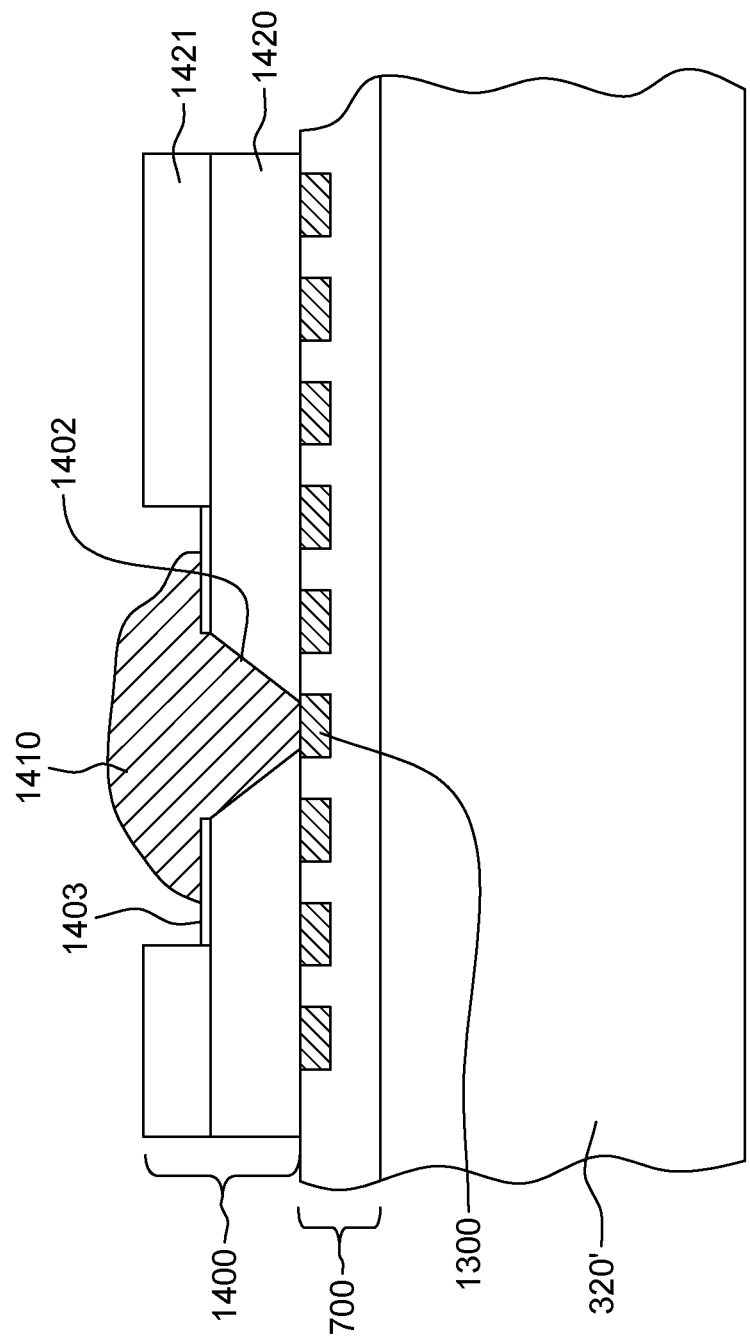
FIG. 14B is a partial cross-sectional elevational view of a tamper-respondent assembly which includes a flexible interposer disposed over an in-situ-formed tamper-detect sensor, and which illustrates one embodiment of an input/output contact to the in-situ-formed tamper-detect sensor, in accordance with one or more aspects of the present invention.

By way of further example, FIGS. 13-14B depict additional enhancements to the tamper-respondent assemblies described herein, such as those discussed above in connection with FIGS. 11A-12. One possible security concern with an embodiment such as described above is that the input/output (I/O) sense line contacts for the in-situ-formed tamper-detect sensor may be at a common location, and thus, vulnerable to attack should that location be identified and exposed by an attacker. Disclosed below is a dispersing the input/output contacts to the sense lines of the in-situ-formed tamper-detect sensor over a large area within the secure volume, which would force an attacker to attempt intrusion through a number of locations in order to reach multiple input/output contacts. Forcing multiple attempts exponentially lowers the chances of succeeding without tampering the device. To connect with the sense lines of the in-situ-formed tamper-detect sensor, an overlying flexible interposer may be employed. In one or more implementations, the flexible interposer may include one or more flexible layers with resistive sense lines or traces (such as the above-noted NiCr, Ticer, or Omega-Ply materials), which are advantageously invisible to X-ray imaging, making them harder, or nearly impossible, to identify without extreme reverse engineering.

In one or more embodiments, multiple dispersed connectors, such as the connectors 910 described above in connection with FIGS. 9-10B, as well as FIG. 12, could be employed to electrically connect, for instance, input/output sense line contacts of the in-situ-formed tamper-detect sensor to circuit lines of a flexible interposer disposed over, at least in part, the in-situ-formed tamper-detect sensor. In this manner, the sense lines within the in-situ-formed tamper-detect sensor may be electrically sensed and monitored by the monitor within the secure volume through the flexible interposer, and for instance, a flexible connect cable. Any desired dispersing of the input/output contacts may be employed, including, for instance, across the inner main surface of the enclosure, and/or across one or more inner side surfaces of the enclosure. Further, different model number tamper-respondent assemblies may have different configurations of dispersed input/output contacts, if desired.

FIG. 13 depicts one example of a tamper-respondent assembly with an in-situ-formed tamper-detect sensor having dispersed input/output contacts, in accordance with one or more aspects of the present invention. As shown in FIG. 13, enclosure 320' of a tamper-proof electronic package such as described herein, has sensor lines 701 of an in-situ-formed tamper-detect sensor 700 deposited over the inner surface 705 of enclosure 320', and dispersed input/output sense line contacts 1300. These input/output contacts 1300 allow for electrical contact to the sense lines 701 of the in-situ-formed tamper-detect sensor 700. Those skilled in the art will note from the description provided herein that the input/output contacts 1300 may be provided in a variety of circuit configurations, and with a varying number of input/output contacts 1300, as desired for a particular implementation.

As noted, in one or more embodiments, one or more sensor connection adapters could be employed over the inner surface of enclosure 320' to facilitate electrical connection to the input/output contacts 1300 of in-situ-formed tamper-detect sensor 700, for instance, as described above in connection with the embodiments of FIGS. 9A-10B & 12. In one or more further embodiments, a flexible interposer may be provided with through holes or vias aligned to the input/output contacts 1300 to facilitate electrical connection of one or more circuit lines of the interposer with the sense lines of the in-situ-formed tamper-detect sensor. In this manner, the monitor, or monitor circuitry, may electrically contact the sense lines of the in-situ-formed tamper-detect sensor through the flexible interposer. One embodiment of this is depicted in FIGS. 14A & 14B.

As shown in FIGS. 14A & 14B, the flexible interposer 1400 may, in one or more embodiments, be fabricated to be structurally similar to the flexible tamper-detect sensor 1100 described above in connection with FIGS. 11A-12. In particular, in one or more implementations, the flexible tamper-detect sensor 1100 could include the flexible interposer 1400, that is, the circuit lines and electrical interconnect depicted in FIGS. 14A & 14B.

In the embodiment of FIG. 14A, a separate flexible interposer 1400 is depicted, which may be formed of one or more flexible layers with circuit lines 1401 providing electrical connection to through holes 1402, and conductive pads 1403. Further, flexible interposer 1400 may include a flexible connection cable 1110' which facilitates coupling the interposer to the monitor within the secure volume of the tamper-respondent assembly. As noted, the through holes 1402 within flexible interposer 1400 are positioned and sized to facilitate electrical connection to the underlying input/output contacts 1300 (FIG. 14B) of the in-situ-formed tamper-detect sensor on the inner surface of the enclosure described above. In one or more implementations, circuit lines 1401, as well as the conductive pads 1403 may be formed of a non-metal conductive material. In one or more embodiments, the conductive material could include any of the above-noted NiCr, Ticer, Omega-Ply, etc. materials, which are advantageously invisible to X-rays. Where the flexible interposer 1400 is separate from the flexible tamper-detect sensor, the flexible interposer may be, in one or more implementations, disposed between the in-situ-formed tamper-detect sensor and the flexible tamper-detect sensor.

The above-described structure is illustrated further in the partial cross-sectional elevational depiction of FIG. 14B, which illustrates one electrical interconnect to an underlying input/output contact pad 1300 of in-situ-formed tamper-detect sensor 700 over an inner surface of enclosure 320'. As illustrated, flexible interposer 1400 includes a through hole or via 1402, and in one or more embodiments, is formed as a core 1420 with a cover 1421. In one or more implementations, core 1420 and cover 1421 may each be formed of polyimide. As illustrated, electrical interconnect 1410 extends through via 1402 to electrically interconnect the respective input/output contact 1300 with the conductive pad 1403 surrounding through hole 1402. In one or more implementations, electrical interconnect 1410 may be formed of a carbon-conductive paint or adhesive, which is also difficult to X-ray image.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features.

Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A tamper-respondent assembly comprising:
   an enclosure to enclose, at least in part, one or more electronic components to be protected;
   an in-situ-formed tamper-detect sensor over an inner surface of the enclosure; and
   one or more flexible tamper-detect sensors disposed over the in-situ-formed tamper-detect sensor, with the in-situ-formed tamper-detect sensor being between the inner surface of the enclosure and the flexible tamper-detect sensor(s), and wherein together the in-situ-formed tamper-detect sensor and the flexible tamper-detect sensor(s) facilitate defining, at least in part, a secure volume about the electronic component(s).

2. The tamper-respondent assembly of claim 1, wherein the flexible tamper-detect sensor(s) lines the inner surface of the enclosure over the in-situ-formed tamper-detect sensor and comprises at least one flexible layer with sensor lines disposed thereon, and wherein the in-situ-formed tamper-detect sensor comprises metal sensor lines, and the sensor lines of the flexible tamper-detect sensor(s) comprise non-metal sensor lines.

3. The tamper-respondent assembly of claim 1, further comprising a monitor to monitor the in-situ-formed tamper-detect sensor and the flexible tamper-detect sensor(s) for a tamper event, and at least one flexible connect cable electrically coupled to at least one of the in-situ-formed tamper-detect sensor or the flexible tamper-detect sensor(s) to facilitate electrically connecting the monitor to sensor lines of the at least one of the in-situ-formed tamper-detect sensor or the flexible tamper-detect sensor(s).

4. The tamper-respondent assembly of claim 3, further comprising a sensor connection adapter disposed over the in-situ-formed tamper-detect sensor within the secure volume, the sensor connection adapter facilitating electrically connecting the monitor to sensor lines of the in-situ-formed tamper-detect sensor.

5. The tamper-respondent assembly of claim 4, wherein the sensor connection adapter is disposed between the in-situ-formed tamper-detect sensor and the flexible tamper-detect sensor(s).

6. The tamper-respondent assembly of claim 4, wherein the sensor connection adapter electrically connects to the sensor lines of the in-situ-formed tamper-detect sensor via at least one connector, the at least one connector comprising a connector type selected from the group consisting of a wire-bond connector, a solder-ball connector, a spring connector, and a zebra strip connector.

7. The tamper-respondent assembly of claim 3, wherein the flexible connect cable electrically couples to the in-situ-formed tamper-detect sensor(s) within the secure volume.

8. The tamper-respondent assembly of claim 7, wherein the monitor electrically couples to the in-situ-formed tamper-detect sensor through the at least one flexible connect cable and a flexible interposer disposed, at least in part, over the in-situ-formed tamper-detect sensor.

9. The tamper-respondent assembly of claim 8, wherein the flexible interposer includes multiple electrical contacts to sensor line contacts of the in-situ-formed tamper-detect sensor, the sensor line contacts being dispersed across the in-situ-formed tamper-detect sensor over the inner surface of the enclosure.

10. The tamper-respondent assembly of claim 9, wherein the multiple electrical contacts, and conductive traces of the flexible interposer, are formed of a conductive material invisible to X-ray imaging.

11. The tamper-respondent assembly of claim 9, where the flexible tamper-detect sensor(s) comprises the flexible interposer.

12. A tamper-respondent assembly comprising:
a circuit board;
an enclosure to secure to the circuit board and enclose, at least in part, one or more electronic components to be protected;
an in-situ-formed tamper-detect sensor over an inner surface of the enclosure; and
one or more flexible tamper-detect sensors disposed over the in-situ-formed tamper-detect sensor, with the in-situ-formed tamper-detect sensor being between the inner surface of the enclosure and the flexible tamper-detect sensor(s), and wherein together the in-situ-formed tamper-detect sensor and the flexible tamper-detect sensor(s) facilitate defining, at least in part, a secure volume about the electronic component(s).

13. The tamper-respondent assembly of claim 12, wherein the flexible tamper-detect sensor(s) lines the inner surface of the enclosure over the in-situ-formed tamper-detect sensor and comprises at least one flexible layer with sensor lines disposed thereon, and wherein the in-situ-formed tamper-detect sensor comprises metal sensor lines, and the sensor lines of the flexible tamper-detect sensor(s) comprise non-metal sensor lines.

14. The tamper-respondent assembly of claim 12, wherein the circuit board comprises a multilayer circuit board, and the tamper-respondent assembly further includes:
an embedded tamper-detect sensor embedded within the multilayer circuit board, wherein the in-situ-formed tamper-detect sensor, the flexible tamper-detect sensor(s), and the embedded tamper-detect sensor together facilitate defining the secure volume about the electronic component(s).

15. The tamper-respondent assembly of claim 12, further comprising a monitor to monitor the in-situ-formed tamper-detect sensor and flexible tamper-detect sensor(s) for a tamper event, and at least one flexible connect cable electrically coupled to at least one of the in-situ-formed tamper-detect sensor or the flexible tamper-detect sensor(s) to facilitate electrically connecting the monitor to sensor lines of the at least one of the in-situ-formed tamper-detect sensor or the flexible tamper-detect sensor(s).

16. The tamper-respondent assembly of claim 15, wherein the flexible connect cable electrically couples to the in-situ-formed tamper-detect sensor(s) within the secure volume.

17. The tamper-respondent assembly of claim 16, wherein the monitor electrically couples to the in-situ-formed tamper-detect sensor through the at least one flexible connect cable and a flexible interposer disposed, at least in part, over the in-situ-formed tamper-detect sensor.

18. The tamper-respondent assembly of claim 17, wherein the flexible interposer includes multiple electrical contacts to the sensor line contacts of the in-situ-formed tamper-detect sensor, the sensor line contacts being dispersed across the in-situ-formed tamper-detect sensor over the inner surface of the enclosure.

19. The tamper-respondent assembly of claim 18, wherein the flexible tamper-detect sensor(s) comprises the flexible interposer.

20. A method of fabricating a tamper-respondent assembly comprising:
providing an enclosure to enclose, at least in part, one or more electronic components to be protected;
fabricating an in-situ-formed tamper-detect sensor over an inner surface of the enclosure;
forming one or more flexible tamper-detect sensors; and
securing the flexible tamper-detect sensor(s) over the in-situ-formed tamper-detect sensor, with the in-situ-formed tamper-detect sensor being between the inner surface of the enclosure and flexible tamper-detect sensor(s), and wherein together the in-situ-formed tamper-detect sensor and the flexible tamper-detect sensor(s) facilitate defining, at least in part, a secure volume about the electronic component(s).

* * * * *